(12) United States Patent
Yu et al.

(10) Patent No.: US 12,317,641 B2
(45) Date of Patent: May 27, 2025

(54) PEROVSKITE/SILICON TANDEM PHOTOVOLTAIC DEVICE

(71) Applicants: Arizona Board of Regents on behalf of Arizona State University, Scottsdale, AZ (US); The University of North Carolina at Chapel Hill, Chapel Hill, NC (US)

(72) Inventors: Zhengshan Yu, Gilbert, AZ (US); Zachary Holman, Phoenix, AZ (US); Bo Chen, Chapel Hill, NC (US); Jinsong Huang, Chapel Hill, NC (US)

(73) Assignees: Arizona Board of Regents on behalf of Arizona State University, Scottsdale, AZ (US); The University of North Carolina at Chapel Hill, Chapel Hill, NC (US)

( * ) Notice: Subject to any disclaimer, the term of this patent is extended or adjusted under 35 U.S.C. 154(b) by 0 days.

(21) Appl. No.: 17/634,788

(22) PCT Filed: Aug. 12, 2020

(86) PCT No.: PCT/US2020/046008
§ 371 (c)(1),
(2) Date: Feb. 11, 2022

(87) PCT Pub. No.: WO2021/030491
PCT Pub. Date: Feb. 18, 2021

(65) Prior Publication Data
US 2022/0344106 A1    Oct. 27, 2022

Related U.S. Application Data

(60) Provisional application No. 62/885,687, filed on Aug. 12, 2019.

(51) Int. Cl.
*H01G 9/20* (2006.01)
*H01G 9/00* (2006.01)
(Continued)

(52) U.S. Cl.
CPC ......... *H10F 77/703* (2025.01); *H01G 9/0036* (2013.01); *H01G 9/2009* (2013.01);
(Continued)

(58) Field of Classification Search
CPC ........ H10K 30/57; H10K 30/30; H10K 30/40; H01G 9/2072; H01G 9/0036;
(Continued)

(56) References Cited

U.S. PATENT DOCUMENTS 9,368,671 B2    6/2016   Wojtczuk et al.
10,069,025 B2   9/2018   Snaith et al.
(Continued)

FOREIGN PATENT DOCUMENTS

CN    105493304      4/2016
CN    109473502 A    3/2019
(Continued)

OTHER PUBLICATIONS

Luo et al, Perovskite Solar Cells on Corrugated Substrates with Enhanced Efficiency, small 2016, 12, No. 46, 6346-6352. (Year: 2016).*
(Continued)

*Primary Examiner* — Andrew J Golden
(74) *Attorney, Agent, or Firm* — Fish & Richardson P.C.

(57) ABSTRACT

A tandem photovoltaic device includes a silicon photovoltaic cell having a silicon layer, a perovskite photovoltaic cell having a perovskite layer, and an intermediate layer between a rear side of the perovskite photovoltaic cell and a front (sunward) side of the silicon photovoltaic cell. The front side of the silicon layer has a textured surface, with a peak-to-
(Continued)

valley height of structures in the textured surface of less than 1 μm or less than 2 μm. The textured surface is planarized by the intermediate layer or a layer of the perovskite photovoltaic cell. Forming the tandem photovoltaic device includes texturing a silicon containing layer of a silicon photovoltaic cell and operatively coupling a perovskite photovoltaic cell comprising a perovskite layer to the silicon photovoltaic cell, thereby forming a tandem photovoltaic device and planarizing the textured surface of the silicon containing layer of the silicon photovoltaic cell.

27 Claims, 8 Drawing Sheets

(51) Int. Cl.
  H10F 71/00     (2025.01)
  H10F 77/122    (2025.01)
  H10F 77/70     (2025.01)
  H10K 19/20     (2023.01)
  H10K 30/10     (2023.01)
  H10K 30/30     (2023.01)
  H10K 30/40     (2023.01)
  H10K 30/57     (2023.01)
  H10K 30/88     (2023.01)
  H10K 85/50     (2023.01)

(52) U.S. Cl.
  CPC ......... *H01G 9/2072* (2013.01); *H10F 71/121* (2025.01); *H10F 77/122* (2025.01); *H10K 19/20* (2023.02); *H10K 30/40* (2023.02); *H10K 30/57* (2023.02); *H10K 30/88* (2023.02); *H10K 85/50* (2023.02); *H10K 30/10* (2023.02); *H10K 30/30* (2023.02)

(58) Field of Classification Search
  CPC ............ H01G 9/2009; H01L 31/02363; H01L 31/028; H01L 2031/0344; H10F 77/703; H10F 77/122; H10F 71/121
  See application file for complete search history.

(56) References Cited

U.S. PATENT DOCUMENTS

| | | | |
|---|---|---|---|
| 2003/0178057 A1* | 9/2003 | Fujii | H01L 31/02363 136/246 |
| 2005/0056312 A1 | 3/2005 | Young et al. | |
| 2010/0015756 A1* | 1/2010 | Weidman | H01L 31/022425 438/96 |
| 2012/0234390 A1 | 9/2012 | Gibson | |
| 2014/0034125 A1 | 2/2014 | Pernel et al. | |
| 2016/0190377 A1* | 6/2016 | Green | H10K 30/10 438/74 |
| 2017/0033250 A1 | 2/2017 | Ballif et al. | |
| 2017/0073530 A1 | 3/2017 | Jin et al. | |
| 2018/0019358 A1 | 1/2018 | Ahn | |
| 2018/0040747 A1 | 2/2018 | Matsuyama | |
| 2018/0083151 A1 | 3/2018 | Shibasaki et al. | |
| 2018/0158976 A1 | 6/2018 | Ahn | |
| 2018/0166504 A1 | 6/2018 | Kamino et al. | |
| 2018/0174761 A1 | 6/2018 | Kamino et al. | |
| 2018/0175112 A1* | 6/2018 | Robinson | H10K 30/20 |
| 2018/0277691 A1* | 9/2018 | Kärkkäinen | H10K 30/82 |
| 2018/0374977 A1* | 12/2018 | Geerligs | H01L 31/02245 |
| 2022/0416107 A1 | 12/2022 | Yu et al. | |

FOREIGN PATENT DOCUMENTS

| | | | |
|---|---|---|---|
| CN | 109524294 | | 3/2019 |
| EP | 477424 B1 * | 2/1995 | ....... H01L 31/02363 |
| EP | 3457448 | | 3/2019 |
| GB | 2566293 | | 3/2019 |
| JP | H6-204541 | | 7/1994 |
| JP | H10-303443 | | 11/1998 |
| JP | 2003-110128 | | 4/2003 |
| JP | 2015-232162 | | 12/2015 |
| JP | 2017-168499 | | 9/2017 |
| JP | 2018-11058 A | | 1/2018 |
| KR | 10-2019-0016927 | | 2/2019 |
| KR | 10-2019-0055616 A | | 5/2019 |
| WO | WO 2010112129 | | 10/2010 |
| WO | WO 2017105248 | | 6/2017 |
| WO | WO 2017/195722 | | 11/2017 |
| WO | WO 2017200000 A1 | | 11/2017 |
| WO | WO 2018150203 | | 8/2018 |
| WO | WO 2018221914 | | 12/2018 |
| WO | WO 2019116031 | | 6/2019 |
| WO | WO 2019227083 | | 11/2019 |

OTHER PUBLICATIONS

EP-477424-B1 English machine translation (Year: 1995).*
Abdi-Jalebi et al., (2018), "Maximizing and stabilizing luminescence from halide perovskites with potassium passivation," Nature, 555:497-501.
Alam et al., (2016), "Thermodynamic efficiency limits of classical and bifacial multi-junction tandem solar cells: An analytical approach," Applied Physics Letters, 109(17):173504, 6 pages.
Albrecht et al., (2016), "Monolithic perovskite/silicon-heterojunction tandem solar cells processed at low temperature," Energy Environ. Sci., 9:81-88.
Albrecht et al., (2016), "Towards optical optimization of planar monolithic perovskite/silicon-heterojunction tandem solar cells", J. Opt., 18(6):64012, 10 pages.
Angermann et al., (2008), "Wet-chemical passivation of atomically flat and structured silicon substrates for solar cell application," Applied Surface Science, 254(12):3615-3625.
Asadpour et al., (2015). "Bifacial Si heterojunction-perovskite organic-inorganic tandem to produce highly efficient ($\eta T^* \sim 33\%$) solar cell," Applied Physics Letters, 106(24):243902, 5 pages.
Asgharzadeh et al., (2018), "A Sensitivity Study of the Impact of Installation Parameters and System Configuration on the Performance of Bifacial PV Arrays," IEEE Journal of Photovoltaics, 8(3):798-805.
Avila et al., (2018), "High voltage vacuum-deposited CH3NH3PbI3—CH3NH3PbI3 tandem solar cells," Energy Environ. Sci., 11:3292-3297.
Avila, et al., (2017), "Vapor-deposited perovskites: the route to high-performance solar cell production?" Joule, 1:431-442.
Babaei et al., (2019), "Preparation and characterization of mixed halide MAPbI3—xClx perovskite thin films by three-source vacuum deposition," Energy Technol., 8:1900784, 5 pages.
Baker-Finch et al., (2010), "A freeware program for precise optical analysis of the front surface of a solar cell," 2010 35th IEEE Photovoltaic Specialists Conference, Honolulu, HI, USA, Jun. 20-25, 2010, pp. 002184-002187.
Baker-Finch et al., (2011), "Reflection of normally incident light from silicon solar cells with pyramidal texture," Prog. Photovolt.: Res. Appl., 19:406-416.
Baker-Finch et al., (2013), "Reflection distributions of textured monocrystalline silicon: implications for silicon solar cells," Prog. Photovolt: Res. Appl., 21:960-971.
Baldridge et al., (2009), "The ASTER spectral library version 2.0," Remote Sensing of Environment, 113(4):711-715.
Basu et al., (2010), "Regulated low cost pre-treatment step for surface texturization of large area industrial single crystalline silicon solar cell," Solar Energy Materials and Solar Cells, 94(6):1049-1054.
Basu et al., (2013), "Liquid silicate additive for alkaline texturing of mono-Si wafers to improve process bath lifetime and reduce IPA consumption," Solar Energy Materials and Solar Cells, 113:37-43.
Baum et al., (1998), "Contact Angle, Gas Bubble Detachment, and Surface Roughness in the Anisotropic Dissolution of Si(100) in Aqueous KOH," Langmuir, 14(10):2925-2928.

(56) References Cited

OTHER PUBLICATIONS

Beal et al., (2016), "Cesium lead halide perovskites with improved stability for tandem solar cells," J. Phys. Chem. Lett., 7:746-751.
Becker et al., (2018), "Monocrystalline 1.7-eV-Bandgap MgCdTe Solar Cell With 11.2% Efficiency," IEEE Journal of Photovoltaics, 8(2):581-586.
Bi et al., (2015), "Low-temperature fabrication of efficient wide-bandgap organolead trihalide perovskite solar cells," Adv. Energy Mater., 5:1401616, 6 pages.
Bi et al., (2016), "Efficient luminescent solar cells based on tailored mixed-cation perovskites," Sci. Adv., 2:e1501170, 8 pages.
Bi et al., (2017), "Efficient flexible solar cell based on composition-tailored hybrid perovskite," Adv. Mater., 29:1605900, 6 pages.
Bischak et al., (2017), "Origin of reversible photoinduced phase separation in hybrid perovskites," Nano Lett., 17:1028-1033.
Boccard et al., (2017), "Low-refractive-index nanoparticle interlayers to reduce parasitic absorption in metallic rear reflectors of solar cells," Phys. Status Solidi A., 214(10):1700179, 6 pages.
Bolinger et al., (2018), "Utility-Scale Solar—Empirical Trends in Project Technology, Cost, Performance, and PPA Pricing in the United States," Lawrence Berkeley National Laboratory, 62 pages.
Branham et al., (2015), "15.7% Efficient 10-µm-thick crystalline silicon solar cells using periodic nanostructures," Adv Mater, 27(13):2182-2188.
Bremner et al., (2008), "Analysis of tandem solar cell efficiencies under AM1.5G spectrum using a rapid flux calculation method," Prog. Photovolt.: Res. Appl., 16(3):225-233.
Brenner et al., (2016), "Hybrid organic-inorganic perovskites: low-cost semiconductors with intriguing charge-transport properties," Nat. Rev. Mater., 1:15007, 17 pages.
Bush et al., (2017), "23.6%-efficient monolithic perovskite/silicon tandem solar cells with improved stability," Nat. Energy, 2:17009, 7 pages.
Bush et al., (2018), "Compositional engineering for efficient wide band gap perovskites with improved stability to photoinduced phase segregation," ACS Energy Lett., 3:428-435.
Bush et al., (2018), "Controlling thin-film stress and wrinkling during perovskite film formation," ACS Energy Lett., 3:1225-1232.
Bush et al., (2018), "Minimizing current and voltage losses to reach 25% efficient monolithic two-terminal perovskite-silicon tandem solar cells," ACS Energy Lett., 3:2173-2180.
Cai et al., (2017), "Cost-performance analysis of perovskite solar modules," Adv. Sci., 4:1600269, 6 pages.
Campbell et al., (1987), "Light trapping properties of pyramidally textured surfaces," J. Appl. Phys., 62:243-249.
Caprioglio et al., (2019), "On the Relation between the Open-Circuit Voltage and Quasi-Fermi Level Splitting in Efficient Perovskite Solar Cells," Advanced Energy Materials, 9:1901631, 10 pages.
Chae et al., (2015), "Chloride incorporation process in CH3NH3PbI3—xClx perovskites via nanoscale bandgap maps," Nano Lett., 15:8114-8121.
Chen et al., (2012), "Micro-textured conductive polymer/silicon heterojunction photovoltaic devices with high efficiency," Applied Physics Letters, 101(3):033301, 6 pages.
Chen et al., (2016), "Efficient semitransparent perovskite solar cells for 23.0%-efficiency perovskite/silicon four terminal tandem cells," Adv. Energy Mater., 6:1601128, 7 pages.
Chen et al., (2017), "Progress in tandem solar cells based on hybrid organic-inorganic perovskites," Adv. Energy Mater., 7:1602400, 19 pages.
Chen et al., (2018), "Nanophotonic Light Management for Perovskite-Silicon Tandem Solar Cells", submitted Jan. 22, 2018, arXiv:1801.07252, 14 pages.
Chen et al., (2019), "Grain engineering for perovskite/silicon monolithic tandem solar cells with efficiency of 25.4%," Joule, 3:177-190.
Chen et al., (2019), "Imperfections and their passivation in halide perovskite solar cells," Chem. Soc. Rev., 48:3842-3867.
Chen et al., (2020), "Blade-Coated Perovskites on Textured Silicon for 26%-Efficient Monolithic Perovskite/Silicon Tandem Solar Cells," Joule, 4(4):850-864.
Chung et al., (2017), "Modeling and designing multilayer 2D perovskite / silicon bifacial tandem photovoltaics for high efficiencies and long-term stability," Opt. Express, 25(8):A311-A322.
Deligiannis et al., (2014), "Wet-chemical treatment for improved surface passivation of textured silicon heterojunction solar cells," Energy Procedia, 55:197-202.
Deline et al., (2017), "Assessment of Bifacial Photovoltaic Module Power Rating Methodologies—Inside and Out," IEEE Journal of Photovoltaics, 7(2):575-580.
Deng et al., (2018), "Surfactant-controlled ink drying enables high-speed deposition of perovskite films for efficient photovoltaic modules, " Nat. Energy, 3:560-566.
Deng et al., (2019), "Tailoring solvent coordination for high-speed, room-temperature blading of perovskite photovoltaic films," Sci. Adv., 5:eaax7537, 9 pages.
Dhere et al., (2006), "Investigation of Cd1—xMgxTe Alloys for Tandem Solar Cell Applications," 4th IEEE World Conference on Photovoltaic Energy Conference, Waikoloa, HI, USA, 4 pages.
Dittrich et al., (2016), "Diffusion length of photo-generated charge carriers in layers and powders of CH3NH3PbI3 perovskite," Applied Physics Letters, 109(7):073901, 5 pages.
Divitini et al., (2016), "In situ observation of heat-induced degradation of perovskite solar cells," Nature Energy, vol. 1, 6 pages.
Dong et al., (2015), "Abnormal crystal growth in CH3NH3PbI3—xClx using a multi-cycle solution coating process," Energy Environ. Sci., 8:2464-2470.
Duan et al., (2018), "High Performance Organic-Nanostructured Silicon Hybrid Solar Cell with Modified Surface Structure," Nanoscale Res Lett, 13(1):283, 6 pages.
Dupre et al., (2018), "Field Performance versus Standard Test Condition Efficiency of Tandem Solar Cells and the Singular Case of Perovskites/Silicon Devices," J. Phys. Chem. Lett., 9(2):446-458.
Eperon et al., (2014), "Formamidinium lead trihalide: a broadly tunable perovskite for efficient planar heterojunction solar cells," Energy Environ. Sci., 7:982-988.
Eperon et al., (2015), "Inorganic caesium lead iodide perovskite solar cells," J. Mater. Chem. A, 3:19688-19695.
Essig et al., (2017), "Raising the one-sun conversion efficiency of III-V/Si solar cells to 32.8% for two junctions and 35.9% for three junctions," Nature Energy, 2(9):17144, 9 pages.
Extended European Search Report in European Appln. No. 20852630.1, dated May 26, 2023, 11 pages.
Extended European Search Report in European Appln. No. 20903185.5, dated Mar. 27, 2023, 11 pages.
Fan et al., (2017), "Toward full solution processed perovskite/Si monolithic tandem solar device with PCE exceeding 20%," Sol. RRL, 1:1700149, 8 pages.
Firth et al., (2018), "Aerosol Impaction-Driven Assembly System for the Production of Uniform Nanoparticle Thin Films with Independently Tunable Thickness and Porosity," ACS Appl. Nano Mater., 1:4351-4357.
Fischer et al., (2020), "International Technology Roadmap for Photovoltaic (ITRPV) 2019 Results," VDMA Photvoltaic Equipment, Eleventh Edition, 88 pages.
Fu et al., (2018), "U.S. Solar Photovoltaic System Cost Benchmark: Q1 2018," National Renewable Energy Laboratory, NREL/TP-6A20-72399, 63 pages.
Gangopadhyay et al., (2006), "A novel low cost texturization method for large area commercial mono-crystalline silicon solar cells," Solar Energy Materials and Solar Cells, 90(20):3557-3567.
Ge et al., (2015), "Substantial Improvement of Short Wavelength Response in n-SiNW/PEDOT:PSS Solar Cell," Nanoscale Res Lett, 10(1):330, 8 pages.
Gil-Escrig et al., (2018), "Vacuum deposited triple-cation mixed-halide perovskite solar cells," Adv. Energy Mater., 8:1703506, 6 pages.
Grancini et al., (2017), "One-year stable perovskite solar cells by 2D/3D interface engineering," Nat. Commun., 8:15684, 8 pages.
Green, (2000), "The Future of Crystalline Silicon Solar Cells," Prog. Photovolt. Res. Appl., 8, 127-139.

(56) References Cited

OTHER PUBLICATIONS

Grover et al., (2013), "Reformulation of solar cell physics to facilitate experimental separation of recombination pathways," Appl. Phys. Lett., 103(9):093502, 6 pages.

Hao et al., (2014), "High efficiency solar cells on direct kerfless 156 mm mono crystalline Si wafers by high throughput epitaxial growth," 2014 IEEE 40th Photovoltaic Specialist Conference (PVSC), Denver, CO, USA, Jun. 8-13, 2014, pp. 2978-2982.

Haug et al., (2017), "Fourier light scattering model for treating textures deeper than the wavelength," Opt. Express, 25(4):A14-A22.

He et al., (2015), "Realization of 13.6% Efficiency on 20 μm Thick Si/Organic Hybrid Heterojunction Solar Cells via Advanced Nanotexturing and Surface Recombination Suppression," ACS Nano, 9(6):6522-6531.

Heckelmann et al., (2015), "Investigations on AlxGa1—xAs Solar Cells Grown by MOVPE," IEEE Journal of Photovoltaics, 5(1):446-453.

Hendriks et al., (2017), "2-Methoxyethanol as a new solvent for processing methylammonium lead halide perovskite solar cells," J. Mater. Chem. A, 5:2346-2354.

Heo et al, (2016), "CH3NH3PbBr3—CH3NH3PbI3 Perovskite-Perovskite Tandem Solar Cells with Exceeding 2.2 V Open Circuit Voltage," Adv. Mater., 28:5121-5125.

Heo et al., (2016), "Highly efficient CH3NH3PbI3_xClx mixed halide perovskite solar cells prepared by re-dissolution and crystal grain growth via spray coating," J. Mater. Chem. A, 4(45):17636-17642.

Hoke et al., (2015), "Reversible photo-induced trap formation in mixed-halide hybrid perovskites for photovoltaics," Chem. Sci., 6:613-617.

Horowitz et al., (2015), "A bottom-up cost analysis of a high concentration PV module," 11th International Conference on Concentrator Photovoltaic Systems, Aix-les-Bains, France; AIP Conference Proceedings, 2015, 1679:100001, 7 pages.

Hou et al., (2020), "Efficient tandem solar cells with solution-processed perovskite on textured crystalline silicon," Science, 367:1135-1140.

Hsiao et al., (2016), "Efficient all-vacuum deposited perovskite solar cells by controlling reagent partial pressure in high vacuum," Adv. Mater., 28:7013-7019.

Hu et al., (2016), "Stabilized wide bandgap MAPbBrxI3-x perovskite by enhanced grain size and improved crystallinity," Adv. Sci., 3:1500301, 6 pages.

Hu et al., (2017), "Recent development of organic-inorganic perovskite-based tandem solar cells," Solar RRL, 1:1700045, 19 pages.

Hwang et al., (2015), "Toward large scale roll-to-roll production of fully printed perovskite solar cells," Adv. Mater., 27:1241-1247.

Ineichen et al., (2002), "A new airmass independent formulation for the Linke turbidity coefficient," Solar Energy, 73(3):151-157.

International Search Report and Written Opinion in International Appln. No. PCT/US2020/046008, dated Nov. 6, 2020, 10 pages.

International Search Report and Written Opinion in International Appln. No. PCT/US2020/066470, dated Mar. 15, 2021, 11 pages.

Jain et al., (2014), "III-V Multijunction Solar Cell Integration with Silicon: Present Status, Challenges and Future Outlook," Energy Harvesting and Systems, 1(3-4):121-145.

Jain et al., (2017), "Enhanced Current Collection in 1.7 eV GaInAsP Solar Cells Grown on GaAs by Metalorganic Vapor Phase Epitaxy," IEEE Journal of Photovoltaics, 7(3):927-933.

Jeon et al., (2014), "Solvent engineering for high-performance inorganic-organic hybrid perovskite solar cells," Nat. Mater., 13:897-903.

Jeong et al., (2013), "All-back-contact ultra-thin silicon nanocone solar cells with 13.7% power conversion efficiency," Nat Commun, 4:2950, 7 pages.

Jiang et al., (2015), "Optimization of a silicon wafer texturing process by modifying the texturing temperature for heterojunction solar cell applications," RSC Advances, 5(85):69629-69635.

Jiang et al., (2016), "A two-terminal perovskite/perovskite tandem solar cell," J. Mater. Chem. A, 4:1208-1213.

Jiang et al., (2019), "Surface passivation of perovskite film for efficient solar cells," Nat. Photon., 13:460-466.

Jones-Albertus et al., (2016), "Technology advances needed for photovoltaics to achieve widespread grid price parity," Prog. Photovolt.: Res. Appl., 24(9):1272-1283.

Jost et al., (2018), "Textured interfaces in monolithic perovskite/silicon tandem solar cells: advanced light management for improved efficiency and energy yield," Energy Environ. Sci., 11:3511-3523.

Ju et al., (2016), "The effect of small pyramid texturing on the enhanced passivation and efficiency of single c-Si solar cells," RSC Advances, 6(55):49831-49838.

Ju et al., (2018), "Influence of small size pyramid texturing on contact shading loss and performance analysis of Ag-screen printed mono crystalline silicon solar cells," Mater. Sci. Semicond. Process., 85:68-75.

Kayabasi et al., (2017), "Determination of micro sized texturing and nano sized etching procedure to enhance optical properties of n-type single crystalline silicon wafer," J Mater Sci: Mater Electron., 28(18):14085-14090.

Kedem et al., (2015), "Light-Induced Increase of Electron Diffusion Length in a p-n Junction Type CH3NH3PbBr3 Perovskite Solar Cell," J Phys Chem Lett, 6(13):2469-2476.

Kegel et al., (2013), "IPA-free Texturization of n-type Si Wafers: Correlation of Optical, Electronic and Morphological Surface Properties," Energy Procedia, 38:833-842.

Kim et al., (2019), "Bimolecular additives improve wide-band-gap perovskites for efficient tandem solar cells with CIGS," Joule, 3:1734-1745.

Kim et al., (2019), "Methylammonium chloride induces intermediate phase stabilization for efficient perovskite solar cells," Joule, 3:2179-2192.

Kobyakov et al., (2011), "Sublimation of Mg onto CdS/CdTe films fabricated by advanced deposition system," 37th IEEE Photovoltaic Specialists Conference, Seattle, WA, USA, 6 pages.

Kohnen et al., (2019), "Highly efficient monolithic perovskite silicon tandem solar cells: analyzing the influence of current mismatch on device performance," Sustainable Energy Fuels, 3:1995-2005.

Kurtz et al., (1990), "Modeling of two-junction, series-connected tandem solar cells using top-cell thickness as an adjustable parameter," J. Appl. Phys., 68(4):1890-1895.

Lee et al., (2011), "Damage-free reactive ion etch for high-efficiency large-area multi-crystalline silicon solar cells," Solar Energy Materials & Solar Cells 95:66-68.

Leijtens et al., (2018), "Opportunities and challenges for tandem solar cells using metal halide perovskite semiconductors," Nature Energy, 3(10):828-838.

Leilaeioun et al., (2020), "Contact Resistivity of the p-Type Amorphous Silicon Hole Contact in Silicon Heterojunction Solar Cells," IEEE Journal of Photovoltaics, 10(1):54-62.

Li et al., (2018), "Cost analysis of perovskite tandem photovoltaics," Joule, 2:1559-1572.

Li et al., (2018), "Scalable fabrication of perovskite solar cells," Nat. Rev. Mater., 3:18017, 20 pages.

Lien et al., (2012), "Optimization of textured structure on crystalline silicon wafer for heterojunction solar cell," Materials Chemistry and Physics, 133(1):63-68.

Lin et al., (2017), "Matching charge extraction contact for wide-bandgap perovskite solar cells," Adv. Mater., 29:1700607, 8 pages.

Llopis et al., (2005), "Influence of texture feature size on the optical performance of silicon solar cells," Prog. Photovolt.: Res. Appl., 13:27-36.

Lo et al., (2015), "New integrated simulation tool for the optimum design of bifacial solar panel with reflectors on a specific site," Renewable Energy, 81:293-307.

Longo et al., (2018), "Fully vacuum-processed wide band gap mixed-halide perovskite solar cells," ACS Energy Lett., 3:214-219.

Lorenz et al., (2015), "Impact of Texture Roughness on the Front-Side Metallization of Stencil-Printed Silicon Solar Cells," IEEE Journal of Photovoltaics, 5(4):1237-1244.

(56) References Cited

OTHER PUBLICATIONS

Luderer et al., (2019), "Passivating and low-resistive poly-Si tunneling junction enabling high-efficiency monolithic perovskite/silicon tandem solar cells," Appl. Phys. Lett. 115(18):182105, 6 pages.

Mailoa et al., (2015), "A 2-terminal perovskite/silicon multijunction solar cell enabled by a silicon tunnel junction," Appl. Phys. Lett., 106:121105, 5 pages.

Manzoor et al., (2017), "Improved light management in planar silicon and perovskite solar cells using PDMS scattering layer," Sol. Energy Mater. Sol. Cells, 173:59-65.

Manzoor et al., (2018), "Optical modeling of wide-bandgap perovskite and perovskite/silicon tandem solar cells using complex refractive indices for arbitrary—bandgap perovskite absorbers," Opt. Express, 26(21):27441-27460.

Manzoor et al., (2020), "Visualizing light trapping within textured silicon solar cells," J. Appl. Phys, 127(6):063104, 15 pages.

Mazzarella et al., (2019), "Infrared light management using a nanocrystalline silicon oxide interlayer in monolithic perovskite/silicon heterojunction tandem solar cells with efficiency above 25%," Adv. Energy Mater., 9:1803241, 9 pages.

McCandless, (2002), "Cadmium Zinc Telluride Films for Wide Band Gap Solar Cells," 29th IEEE Photovoltaic Specialists Conference, New Orleans, LA, USA, 4 pages.

McIntosh et al., (2012), "OPAL 2: Rapid optical simulation of silicon solar cells," 2012 38th IEEE Photovoltaic Specialists Conference (PVSC), 7 pages.

McIntosh et al., (2014), "On effective surface recombination parameters," J. Appl. Phys., 116(1):014503, 11 pages.

McNeekin et al., (2016), "A mixed-cation lead mixed-halide perovskite absorber for tandem solar cells," Science, 351:151-155.

Mohamad et al., (2016), "Spray-cast multilayer organometal perovskite solar cells fabricated in air," Adv. Energy Mater., 6:1600994, 7 pages.

Moreno et al., (2014), "A comparative study of wet and dry texturing processes of c-Si wafers for the fabrication of solar cells," Solar Energy 101:182-191.

Mundhaas et al., (2019), "Series resistance measurements of perovskite solar cells using Jsc-Voc measurements," Sol. RRL, 3:1800378, 5 pages.

Nakajima et al., (2016), "Growth of Si Bulk Crystals with Large Diameter Ratio Using Small Crucibles by Creating a Large Low-Temperature Region Inside a Si Melt Contained in an NOC Furnace Developed Using Two Zone Heaters," Journal of Electronic Materials, 45(6):2837-2846.

Nguyen et al., (2018), "Texture size control by mixing glass microparticles with alkaline solution for crystalline silicon solar cells," J. Mater. Res., 33(11):1515-1522.

Nogay et al., (2019), "25.1%-Efficient Monolithic Perovskite/Silicon Tandem Solar Cell Based on a p-type Monocrystalline Textured Silicon Wafer and High-Temperature Passivating Contacts," ACS Energy Lett., 4:844-845.

Noh et al., (2013), "Chemical management for colorful, efficient, and stable inorganic-organic hybrid nanostructured solar cells," Nano Lett., 13:1764-1769.

NREL. gov [online], "National Solar Radiation Database (NSRDB)," available on or before Jan. 25, 2019, via Internet Archive: Wayback Machine URL <http://web.archive.org/web/20190125202504/https://nsrdb.nrel.gov/nsrdb-viewer>, retrieved on Mar. 16, 2023, URL <https://nsrdb.nrel.gov/nsrdb-viewer>, 1 page.

Office Action in Chinese Appln. No. 202080070541.5, dated May 16, 2023, 16 pages (with English translation).

Onno et al., (2016), "Simulation study of GaAsP/Si tandem solar cells," Solar Energy Materials and Solar Cells, 145:206-216.

Onno et al., (2018), "Numerical analysis of bifacial silicon-based tandem devices: Shifts in the optimum top-cell bandgap with varying albedo," 7th World Conference on Photovoltaic Energy Conversion, Waikoloa, HI, USA, 4 pages.

Palik, (1985), "Ellipsometric Study of Orientation-Dependent Etching of Silicon in Aqueous KOH," J. Electrochem. Soc., 132(4):871-884.

Park et al., (2015), "Bismuth based hybrid perovskites $A_3Bi_2I_9$ (A: methylammonium or cesium) for solar cell application," Adv. Mater., 27:6806-6813.

Pelaez et al., (2019), "Model and Validation of Single-Axis Tracking with Bifacial PV," IEEE Journal of Photovoltaics, 9(3):715-721.

Pelaez, (2019), "Bifacial Solar Modules System Design, Modeling, and Performance," Dissertation for the degree of Doctor of Philosophy, University of Arizona, Department of Electrical & Computer Engineering, 242 pages.

Perez et al., (1993), "All-weather model for sky luminance distribution—preliminary configuration and validation," Solar Energy, 50(3):235-245.

Perez et al., (2002), "A new operational model for satellite-derived irradiances: Description and validation," Solar Energy, 73(5):307-317.

Peters et al., (2016), "Techno-economic analysis of tandem photovoltaic systems," RSC Advances, 6(71):66911-66923.

Pujari et al., (2018), "International Technology Roadmap for Photovoltaics (ITRPV): 2017 Results," ITRPV, Ninth Edition, 71 pages.

Rao et al., (2007), "Patterning of silicon by indentation and chemical etching," Applied Physics Letters, 91(12):123113, 4 pages.

Rehman et al., (2017), "Photovoltaic mixed-cation lead mixed-halide perovskites: links between crystallinity, photo-stability and electronic properties," Energy Environ. Sci., 10:361-369.

Richter et al., (2013), "Reassessment of the Limiting Efficiency for Crystalline Silicon Solar Cells," IEEE Journal of Photovoltaics, 3(4):1184-1191.

Ripalda et al., (2018), "Solar cell designs by maximizing energy production based on machine learning clustering of spectral variations, " Nature Communications, 9(1):5126, 8 pages.

Rolston et al., (2016), "Mechanical integrity of solution-processed perovskite solar cells," Extreme Mechanics Letters, 9:353-358.

Rolston et al., (2018), "Engineering Stress in Perovskite Solar Cells to Improve Stability," Advanced Energy Materials, 8(29):1802139, 7 pages.

Ryyan Khan et al., (2015), "Thermodynamic limit of bifacial double-junction tandem solar cells," Applied Physics Letters, 107(22):223502, 6 pages.

Sahli et al., (2018), "Fully textured monolithic perovskite/silicon tandem solar cells with 25.2% power conversion efficiency," Nature Materials, 17(9):820-826.

Sahli et al., (2018), "Improved optics in monolithic perovskite/silicon tandem solar cells with a nanocrystalline silicon recombination junction," Adv. Energy Mater., 8:1701609, 8 pages.

Sanderson et al., (2019), "International Technology Roadmap for Photovoltaic (ITRPV): 2018 Results," ITRPV, Tenth Edition, 80 pages.

Santbergen et al., (2016), "Minimizing optical losses in monolithic perovskite/c-Si tandem solar cells with a flat top cell," Opt. Express, 24:A1288-A1299.

Schmager et al., (2019), "Methodology of energy yield modelling of perovskite-based multi-junction photovoltaics," Opt Express, 27(8):A507-A523.

Schmidt et al., (2018), "Surface passivation of crystalline silicon solar cells: Present and future," Solar Energy Materials and Solar Cells, 187:39-54.

Shao et al., (2014), "Origin and elimination of photocurrent hysteresis by fullerene passivation in $CH_3NH_3PbI_3$ planar heterojunction solar cells," Nat. Commun., 5:5784, 7 pages.

Shen et al., (2018), "In situ recombination junction between p-Si and $TiO_2$ enables high-efficiency monolithic perovskite/Si tandem cells," Sci. Adv., 4:eaau9711, 13 pages.

Shin et al., (2017), "Colloidally prepared La-doped $BaSnO_3$ electrodes for efficient, photostable perovskite solar cells," Science, 356:167-171.

Shockley et al., (1961), "Detailed Balance Limit of Efficiency of p-n Junction Solar Cells," J. Appl. Phys., 32(3):510-519.

Slavney et al., (2016), "A bismuth-halide double perovskite with long carrier recombination lifetime for photovoltaic applications," J. Am. Chem. Soc., 138:2138-2141.

(56) References Cited

OTHER PUBLICATIONS

Slotcavage et al., (2016), "Light-induced phase segregation in halide-perovskite absorbers," ACS Energy Lett., 1:1199-1205.
Smith et al., (2014), "Toward the Practical Limits of Silicon Solar Cells," IEEE Journal of Photovoltaics, 4(6):1465-1469.
Sofia et al., (2017), "Metal Grid Contact Design for Four-Terminal Tandem Solar Cells," IEEE Journal of Photovoltaics, 7(3):934-940.
Sopori et al., (2015), "Analyses of diamond wire sawn wafers: Effect of various cutting parameters," 2015 IEEE 42nd Photovoltaic Specialist Conference (PVSC), New Orleans, LA, Jun. 14-19, 2015, 6 pages.
Stegemann et al., (2013), "Passivation of Textured Silicon Wafers: Influence of Pyramid Size Distribution, a-Si:H Deposition Temperature, and Post-treatment," Energy Procedia, 38:881-889.
Stolterfoht et al., (2018), "Visualization and suppression of interfacial recombination for high-efficiency large-area pin perovskite solar cells," Nature Energy, 3(10):847-854.
Stolterfoht et al., (2019), "The impact of energy alignment and interfacial recombination on the internal and external open-circuit voltage of perovskite solar cells," Energy & Environmental Science, 12(9):2778-2788.
Stranks et al., (2013), "Electron-Hole Diffusion Lengths Exceeding 1 Micrometer in an Organometal Trihalide Perovskite Absorber," Science, 342:341-344.
Sun et al., (2018), "Optimization and performance of bifacial solar modules: A global perspective," Applied Energy, 212:1601-1610.
Swanson et al., (2018), "CdCl2 passivation of polycrystalline CdMgTe and CdZnTe absorbers for tandem photovoltaic cells," J. Appl. Phys., 123(20):203101, 11 pages.
Swanson, (2005), "Approaching the 29% limit efficiency of silicon solar cells," 31st IEEE Photovoltaic Specialists Conference, Lake Buena Vista, FL, USA, 6 pages.
Swarnkar et al., (2016), "Quantum dot-induced phase stabilization of a-CsPbI3 perovskite for high-efficiency photovoltaics," Science, 354:92-95.
Tamboli et al., (2017), "Low-Cost CdTe/Silicon Tandem Solar Cells," IEEE Journal of Photovoltaics, 7(6):1767-1772.
Tan et al., (2017), "Efficient and stable solution-processed planar perovskite solar cells via contact passivation," Science, 355:722-726.
Todorov et al., (2015), "Monolithic perovskite-CIGS tandem solar cells via in situ band gap engineering," Adv. Energy Mater., 5:1500799, 6 pages.
Tress et al., (2019), "Performance of perovskite solar cells under simulated temperature-illumination real-world operating conditions," Nature Energy, 4(7):568-574.
Vazsonyi et al., (2003), "Anisotropic etching of silicon in a two-component alkaline solution," J. Micromech. Microeng., 13(2):165-169.
VDMA.org [online], (2018), "International Technology Roadmap for Photovoltaic (ITRPV)," available on or before Nov. 30, 2019, via Internet Archive: Wayback Machine URL <http://web.archive.org/web/20191130161657/https://itrpv.vdma.org/en/ueber-uns>, retrieved on May 2, 2023, URL <https://itrpv.vdma.org/>, 4 pages.
Wang et al., (2014), "Development of a 16.8% Efficient 18-μm Silicon Solar Cell on Steel," IEEE Journal of Photovoltaics, 4(6):1397-1404.
Wang et al., (2015), "Doped hole transport layer for efficiency enhancement in planar heterojunction organolead trihalide perovskite solar cells," Nano Energy, 15:275-280.
Ward, (1994), "The RADIANCE lighting simulation and rendering system," SIGGRAPH 1994: 21st Annual Conference on Computer Graphics and Interactive Techniques, Orlando, FL, USA, Computer Graphics Proceedings, Annual Conference Series, 1994, 14 pages.
Werner et al., (2016), "Efficient monolithic perovskite/silicon tandem solar cell with cell area > 1 cm2," J. Phys. Chem. Lett., 7:161-166.
Werner et al., (2016), "Efficient near-infrared-transparent perovskite solar cells enabling direct comparison of 4-terminal and monolithic perovskite/silicon tandem cells," ACS Energy Lett., 1:474-480.
Werner et al., (2016), "Zinc tin oxide as high-temperature stable recombination layer for mesoscopic perovskite/silicon monolithic tandem solar cells," Appl. Phys. Lett., 109:233902, 5 pages.
Wu et al., (2017), "Monolithic perovskite/silicon-homojunction tandem solar cell with over 22% efficiency," Energy Environ. Sci., 10:2472-2479.
Wu et al., (2019), "Bilateral alkylamine for suppressing charge recombination and improving stability in blade-coated perovskite solar cells," Sci. Adv., 5:v8925, 10 pages.
Yan et al., (2019), "A review on the crystalline silicon bottom cell for monolithic perovskite/silicon tandem solar cells," Materials Today Nano, 7:100045, 13 pages.
Yang et al., (2010), "Indentation-induced formation of low-dimensional Si structures in KOH solution," J. Phys. D: Appl. Phys., 43(9):095403, 8 pages.
Yang et al., (2013), "Characterization of 2-D reflection pattern from textured front surfaces of silicon solar cells," Sol. Energy Mater. Sol. Cells, 115:42-51.
Yang et al., (2017), "Iodide management in formamidinium-lead-halide-based perovskite layers for efficient solar cells," Science, 356:1376-1379.
Yang et al., (2018), "High-Bandgap Perovskite Materials for Multijunction Solar Cells," Joule, 2(8):1421-1436.
Yang et al., (2019), "Enhancing electron diffusion length in narrow-bandgap perovskites for efficient monolithic perovskite tandem solar cells," Nature Communications, 10(1):4498, 9 pages.
Yin et al., (2016), "Vapor-assisted crystallization control toward high performance perovskite photovoltaics with over 18% efficiency in the ambient atmosphere," J. Mater. Chem. A, 4:13203-13210.
Yoo, (2010), "Reactive ion etching (RIE) technique for application in crystalline silicon solar cells," Solar Energy 84:730-734.
Yoshikawa et al., (2017), "Silicon heterojunction solar cell with interdigitated back contacts for a photoconversion efficiency over 26%," Nat. Energy, 2:17032, 8 pages.
Yu et al., (2015), "Full-Spectrum, Angle-Resolved Reflectance and Transmittance of Optical Coatings Using the LAMBDA 1050+ UV/VIS/NIR Spectrophotometer with the ARTA Accessory," PerkinElmer Technical Note, 4 pages.
Yu et al., (2016), "Selecting tandem partners for silicon solar cells," Nature Energy, 1:16137, 4 pages.
Yu et al., (2016), "Silicon wafers with optically specular surfaces formed by chemical polishing," J. Mater. Sci.: Mater. Electron, 27:10270-10275.
Yu et al., (2018), "Techno-economic viability of silicon-based tandem photovoltaic modules in the United States," Nature Energy, 3(9):747-753.
Yu et al., (2019), "GaAs/silicon PVMirror tandem photovoltaic mini-module with 29.6% efficiency with respect to the outdoor global irradiance," Prog. Photovolt.: Res. Appl., 27(5):469-475.
Zhao et al., (2014), "Efficient planar perovskite solar cells based on 1.8 eV band gap CH3NH3PbI2Br nanosheets via thermal decomposition," J. Am. Chem. Soc., 136:12241-12244.
Zheng et al., (2017), "Defect passivation in hybrid perovskite solar cells using quaternary ammonium halide anions and cations," Nat. Energy, 2:17102, 9 pages.
Zheng et al., (2018), "Large area efficient interface layer free monolithic perovskite/homo-junction-silicon tandem solar cell with over 20% efficiency," Energy Environ. Sci., 11:2432-2443.
Zhong et al., (2016), "All-Solution-Processed Random Si Nanopyramids for Excellent Light Trapping in Ultrathin Solar Cells," Adv. Funct. Mater., 26(26):4768-4777.
Zhong et al., (2017), "Realization of Quasi-Omnidirectional Solar Cells with Superior Electrical Performance by All-Solution-Processed Si Nanopyramids," Adv. Sci., 4(11):1700200, 9 pages.
Zhou et al., (2016), "Manipulating crystallization of organolead mixed-halide thin films in antisolvent baths for wide-bandgap perovskite solar cells," ACS Appl. Mater. Interfaces, 8:2232-2237.
Zhou et al., (2017), "Benzylamine-treated wide-bandgap perovskite with high thermal-photostability and photovoltaic performance," Adv. Energy Mater., 7:1701048, 7 pages.

(56) References Cited

OTHER PUBLICATIONS

Zhu et al., (2018). "Transparent electrode for monolithic perovskite/silicon-heterojunction two-terminal tandem solar cells," Nano Energy, 45:280-286.
Zuo et al., (2018), "One-step roll-to-roll air processed high efficiency perovskite solar cells," Nano Energy 46:185-192.
Office Action in Japanese Appln. No. 2022-508900, mailed on Jul. 8, 2024, 12 pages (with English translation).

* cited by examiner

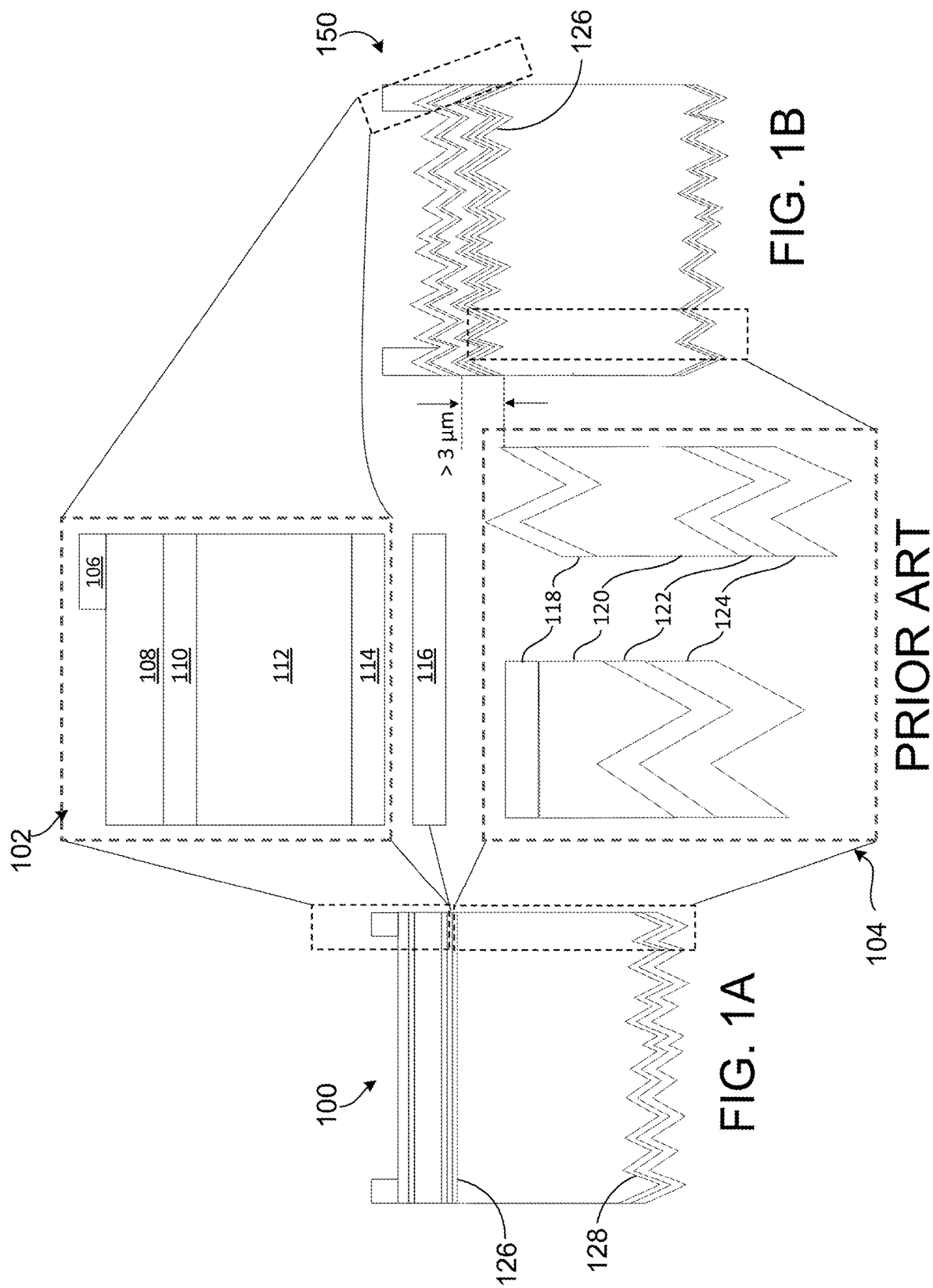

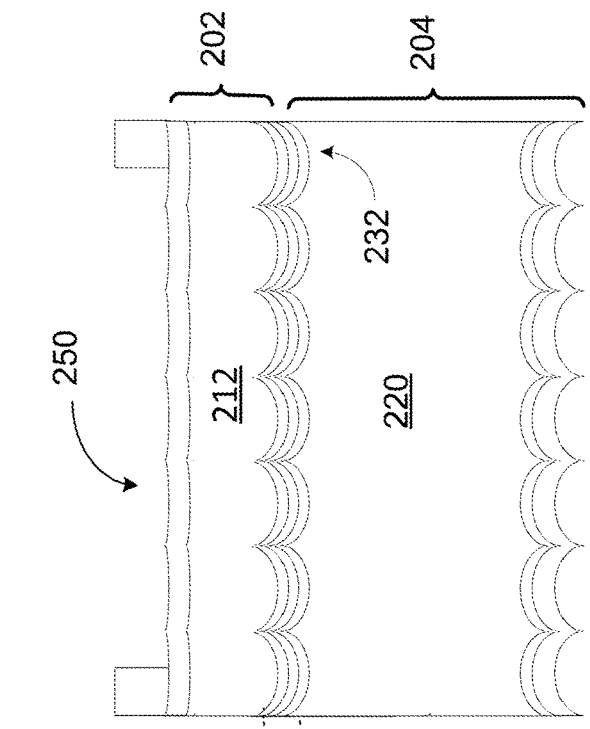
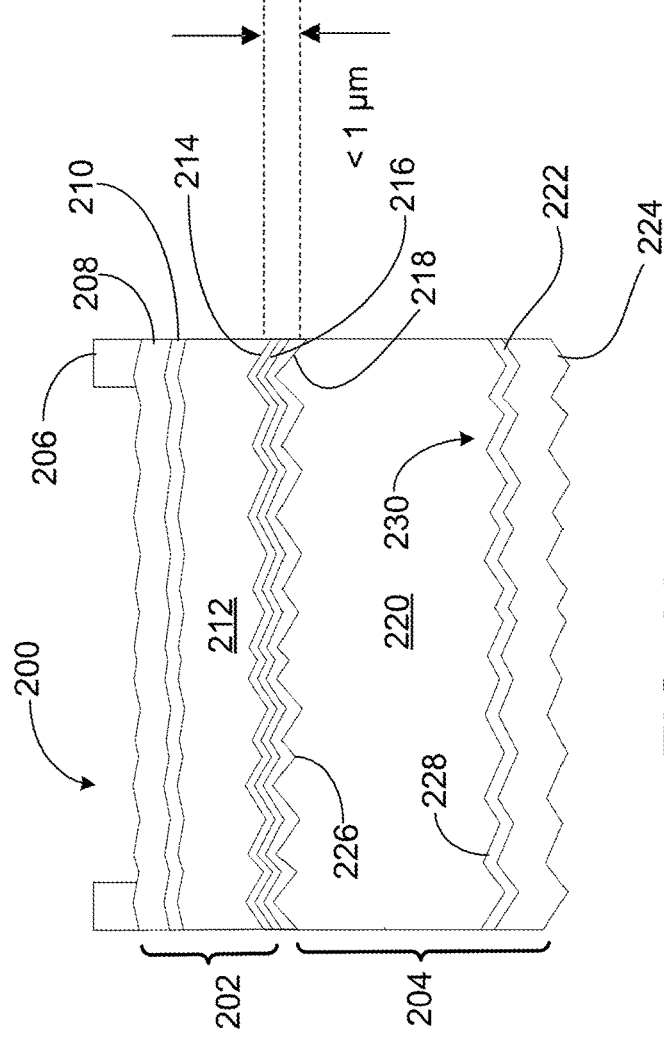

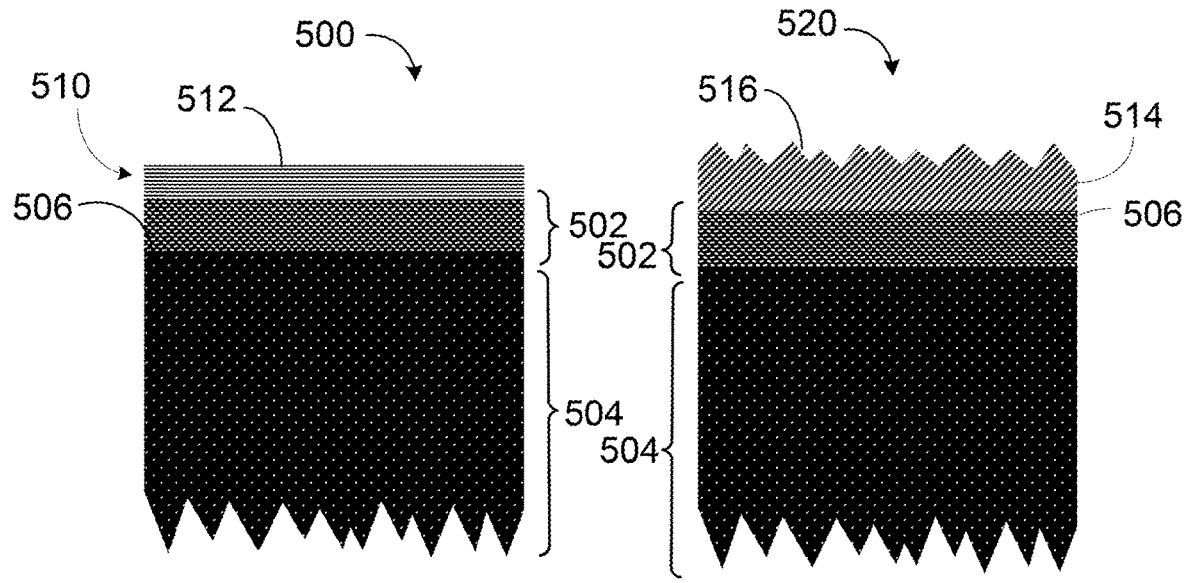
FIG. 5A
FIG. 5B
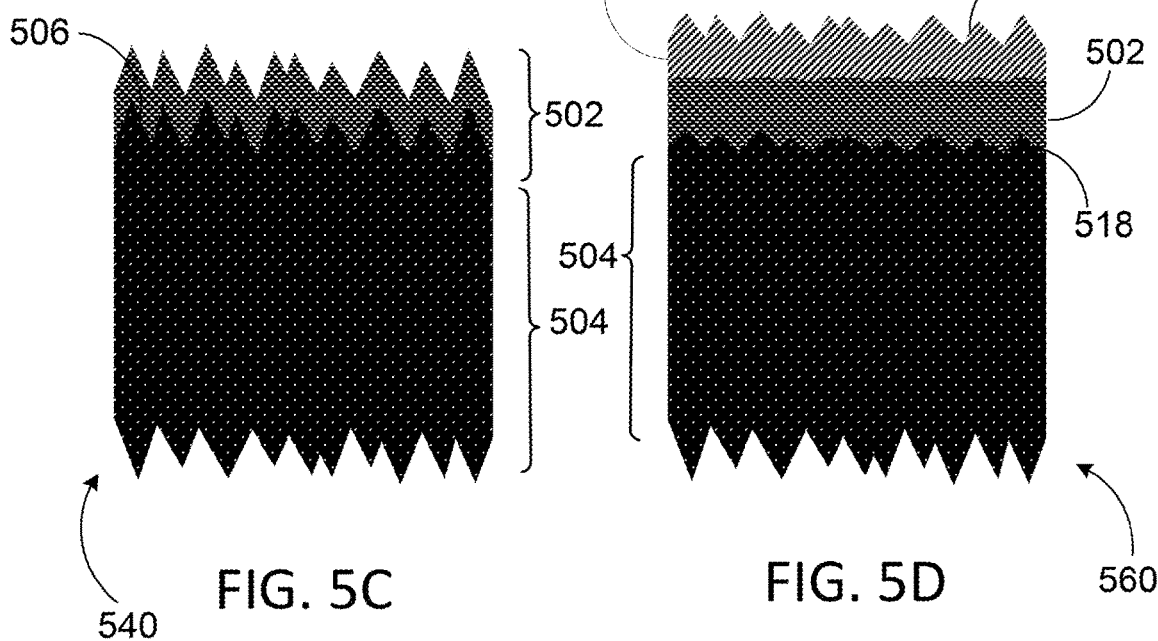
FIG. 5C
FIG. 5D

PEROVSKITE/SILICON TANDEM PHOTOVOLTAIC DEVICE

CROSS-REFERENCE TO RELATED APPLICATIONS

This application is a national stage application of International Application No. PCT/US2020/046008, filed Aug. 12, 2020, which claims the benefit of U.S. Patent Application No. 62/885,687 entitled "PEROVSKITE/SILICON TANDEM PHOTOVOLTAIC DEVICE" and filed on Aug. 12, 2019, which is incorporated herein by reference in its entirety.

STATEMENT OF GOVERNMENT SUPPORT

This invention was made with government support under DE-EE0006709 and DE-EE0008749 awarded by the Department of Energy. The government has certain rights in the invention.

TECHNICAL FIELD

This invention relates to a tandem photovoltaic device including a perovskite solar cell and a silicon solar cell. In particular, this invention relates to the architecture of the tandem photovoltaic device and the surface topology of the constituent cells.

BACKGROUND

In silicon-based "tandem" photovoltaic technology, a solar cell of another material is stacked on top of silicon to make more efficient use of the full solar spectrum. Stacking a perovskite solar cell on top of a silicon cell forms such a perovskite/silicon tandem photovoltaic device. Perovskite/silicon tandem devices are typically fabricated by solution processing perovskite solar cells, layer by layer, on top of a silicon cell. As the solution process is unable to deposit continuous layers on top of rough surfaces (e.g., micrometer-size texture, as in conventional silicon solar cells), the silicon bottom cells used in perovskite/silicon tandem photovoltaic devices typically have a planar front surface, as depicted in FIG. 1A. Drawbacks of this architecture, resulting at least in part from the flat front surface of the silicon cell, include the high surface reflectance and inability to scatter light into the silicon bottom cell, both of which reduce the amount of the light that can be absorbed by the tandem photovoltaic device, and therefore limit the photo-generated current and the device efficiency. In addition to the disadvantage in device performance, tandem structures made with this architecture have significant cost barriers to manufacturing, due at least in part to the flat front surface of the silicon cell, typically formed by cost-prohibitive chemical-mechanical-polishing processes. In some instances, conventional pyramid-textured silicon bottom cells, depicted in FIG. 1B, are used, and the perovskite top cells are deposited conformally (e.g., by an evaporation process), to the pyramidal texture. This architecture reduces the reflectance loss, but typically requires a vacuum process that increases the manufacturing cost and limits the production throughput of perovskite/silicon tandem devices.

SUMMARY

Innovative aspects of the invention include a perovskite/silicon tandem photovoltaic device that utilizes a textured silicon bottom cell and a solution-processed perovskite top cell. The silicon bottom cell features a pyramid-textured surface, with a feature size of less than 2 µm or less than 1 µm. With this pyramid feature size, the surface is rough enough to scatter the light to reduce the reflection loss, but still smooth enough to solution process the perovskite cell. Advantages include solution processability, high throughput, perovskite bandgap tunability, and increased efficiency. An overall cell efficiency of at least 25% can be achieved without a dramatic change to the manufacturing processes of traditional silicon photovoltaic devices.

In a first general aspect, a tandem photovoltaic device includes a silicon photovoltaic cell having a silicon layer, a perovskite photovoltaic cell having a perovskite layer, and an intermediate layer between a rear side of the perovskite photovoltaic cell and a front (sunward) side of the silicon photovoltaic cell. The front side of the silicon layer has a textured surface, with a peak-to-valley height of structures in the textured surface of less than 1 µm or less than 2 µm. The textured surface is planarized by the intermediate layer or a layer of the perovskite photovoltaic cell.

Implementations of the first general aspect may include one or more of the following features.

The textured surface may be planarized by the perovskite layer in the perovskite photovoltaic cell or the intermediate layer. In some cases, the intermediate layer is a recombination layer.

In some cases, the textured surface has angular protrusions. The angular protrusions can be pyramidal, inverted pyramidal, or a combination thereof. In some cases, the textured surface has concave regions.

The silicon photovoltaic cell is typically a bottom cell, and the perovskite photovoltaic cell is typically a top cell. The silicon photovoltaic cell can be a silicon heterojunction cell (e.g., a passivated-emitter-rear-contact cell, a tunnel-oxide-passivated-contact cell, an aluminum-back-surface-field cell, or a combination thereof). The silicon photovoltaic cell, the perovskite photovoltaic cell, or both may include an electron-contact stack, a hole-contact stack, or both.

The tandem photovoltaic device may further include a light-scattering layer.

In a second general aspect, forming a tandem photovoltaic device includes texturing a silicon-containing layer of a silicon photovoltaic cell to yield a textured surface having structures in the textured surface with a peak-to-valley height of less than 1 µm or less than 2 µm, and operatively coupling a perovskite photovoltaic cell comprising a perovskite layer to the silicon photovoltaic cell, thereby forming a tandem photovoltaic device and planarizing the textured surface of the silicon-containing layer of the silicon photovoltaic cell.

Implementations of the second general aspect may include one or more of the following features.

Texturing the silicon-containing layer may include wet chemical etching, plasma dry etching, or nanoimprint lithography. Examples of wet chemical etching include alkaline chemical etching or acid chemical etching.

The perovskite photovoltaic cell is operatively coupled to the silicon photovoltaic cell by an intermediate layer (e.g., a recombination layer).

In some cases, planarizing the textured surface of the silicon-containing layer of the silicon photovoltaic cell includes a blade coating process. In some cases, planarizing the textured surface of the silicon-containing layer of the silicon photovoltaic cell includes disposing the intermediate layer or the perovskite layer on the intermediate layer.

In a third general aspect, a photovoltaic module includes a first cover, a second cover opposite the first cover, and the tandem photovoltaic device of the first general aspect. The tandem photovoltaic device is positioned between the first and second covers.

Implementations of the third general aspect may include one or more of the following features.

In some cases, the first cover, the second cover, or both include a textured glass. In certain cases, the photovoltaic module includes a light-scattering layer.

The details of one or more embodiments of the subject matter of this disclosure are set forth in the accompanying drawings and the description. Other features, aspects, and advantages of the subject matter will become apparent from the description, the drawings, and the claims.

BRIEF DESCRIPTION OF DRAWINGS

FIG. 1A depicts a perovskite/silicon tandem device with a perovskite cell on a planar silicon surface. FIG. 1B depicts a perovskite/silicon tandem structure with a perovskite cell conformal to a textured silicon surface.

FIGS. 2A and 2B depict perovskite/silicon tandem devices with a pyramid-textured silicon bottom cell and a convex-shape-textured silicon bottom cell, respectively.

FIGS. 5A-5D depict different perovskite/silicon tandem devices.

DETAILED DESCRIPTION

Figure 3B:
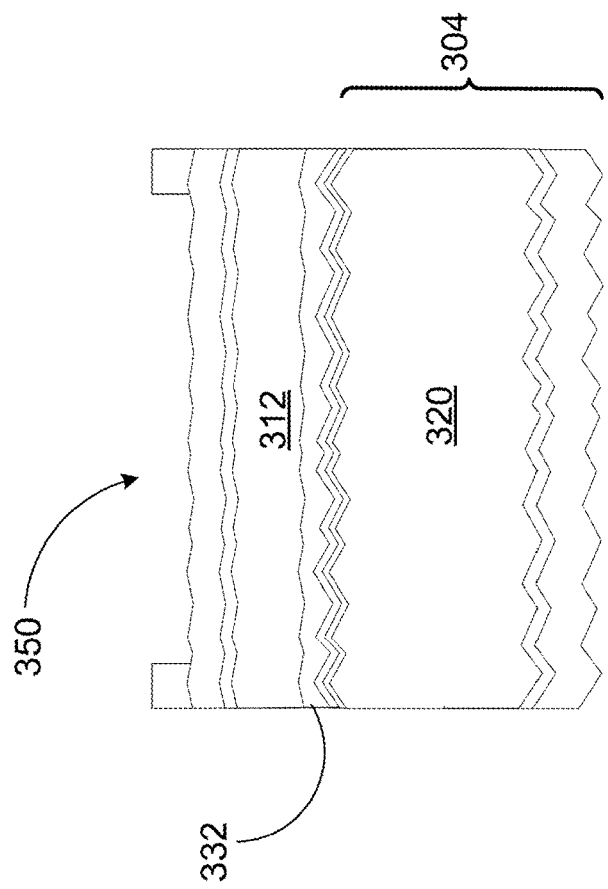
FIGS. 3A and 3B depict perovskite/silicon tandem devices with pyramidal textured silicon bottom cells planarized by the perovskite layer and by the recombination layer, respectively.

FIG. 1A depicts a prior art tandem device 100, including a perovskite top cell 102 and a textured silicon bottom cell 104, depicted in the upper and lower insets, respectively. The perovskite top cell 102 includes, from its front (sunward) side to rear side, the following layers: a metal grid 106, a transparent conductive layer 108, an electron-contact stack 110, a perovskite absorber 112, and a hole-contact stack 114. A recombination layer 116 is positioned between the perovskite top cell 102 and the silicon bottom cell 104. A thickness of the perovskite top cell 102 is typically in a range of about 0.7 μm to about 3 μm. A thickness of the perovskite absorber 112 is typically in a range of about 0.5 μm to about 1 μm. The silicon bottom cell 104 includes an electron-contact stack 118, a silicon absorber 120, a hole-contact stack 122, and a rear electrode stack 124. A thickness of the textured silicon bottom cell is typically in a range of about 100 μm to about 300 μm. The front side 126 of the silicon absorber 120 of the tandem device 100 is polished to form a planar surface. The rear side 128 of the silicon absorber 120 has a conventional pyramidal texture. As used herein, "conventional pyramidal texture" generally refers to pyramidal features having a mean peak-to-valley height of at least 3 μm (e.g., 3 μm to 10 μm). FIG. 1B depicts a prior art tandem device 150 including a perovskite top cell 102 and a textured silicon bottom cell 104. The front side 126 of the silicon absorber 120 has a conventional pyramidal texture, and the perovskite top cell 102 is deposited conformally on the front side 126 of the silicon absorber 120.

This disclosure describes perovskite/silicon tandem photovoltaic devices that include a textured silicon bottom cell and a planarized perovskite top cell. The texture allows an elongated light path length in the silicon, boosting the bottom cell current compared to a cell with a planar (i.e., flat) front surface. As used herein, a "planarized" surface generally refers to a surface of a layer superimposed over (e.g., covering or in direct contact with) a textured layer, such that the layer fills in depressions in the textured surface to yield a planarized surface having a reduced variation in height relative to the corresponding region of the textured layer. The silicon absorber of the silicon bottom cell typically has a textured front surface with a maximum feature size less than about 1 μm, less than about 1.5 μm, or less than about 2 μm. As described herein with respect to a pyramidal feature or other feature, "feature size" generally refers to peak-to-valley height as measured normal to the macroscopic plane of the silicon absorber. With this feature size, the surface is rough enough to scatter the light to reduce the reflection loss, but still smooth enough to solution process the perovskite cell. The front side 126 of the silicon absorber 120 of the tandem devices 100 and 150 is not considered to be "planarized" as described herein, at least because the front side 126 of the silicon absorber 120 of the tandem device 100 has a flat surface, and the front side 126 of silicon absorber 120 of tandem device 150 has a conventional pyramidal texture with conformal layers formed on the surface. These conformal layers have a height variation substantially the same as that of the textured silicon absorber on which the conformal layers are formed. Chen et al., Joule 4, 1-15 (2020) is incorporated by reference herein for additional details.

In one embodiment of this disclosure, such as that depicted in FIG. 2A, the tandem device 200 includes a perovskite top cell 202 and a silicon bottom cell 204. The perovskite top cell 202 includes, from its front side to rear side, the following layers: a metal grid 206, a transparent conductive layer 208, an electron-contact stack 210, a perovskite absorber 212, and a hole-contact stack 214. A thickness of the hole-contact stack 214 is typically about 30 nm or less. An intermediate layer (e.g., a recombination layer) 216 is positioned between the perovskite top cell 202 and the silicon bottom cell 204. Silicon bottom cell 204 includes an electron-contact stack 218, a silicon absorber 220, a hole-contact layer 222, and a rear-reflector stack 224. The front side 226 and the rear side 228 of the silicon absorber 220 of the tandem device 200 have a pyramidal surface texture 230 formed by alkaline chemical etching. In some embodiments, one or more of the layers described with respect to FIG. 2A are absent. In certain embodiments, the perovskite top cell, the silicon bottom cell, or both may have one or more additional layers not present in the tandem device 200. In one example, a front surface of the perovskite top cell 202 includes a textured light-scattering layer.

Alkaline etching may be used with, for example, monocrystalline silicon wafers. During the etching process, temperature, etchants, time, or some combination thereof, may be applied so that the size of the textured surface (e.g., pyramidal, inverted pyramidal, convex, etc.) formed on the front side of the silicon absorber is less than about 1 μm, less than about 1.5 μm, or less than about 2 μm in height. The etching process may, for example, include etchants of potassium hydroxide, potassium silicate, sodium hydroxide, sodium silicate, isopropyl alcohol, ethanol, or a combination thereof. The contact stacks 218 and 222 may, for example, include amorphous silicon, nano- or micro-crystalline silicon, nano- or micro-crystalline silicon oxide, phosphorous or boron diffused layers, silicon oxide, or a combination thereof. The rear electrode stack 224 may, for example, include indium tin oxide, indium zinc oxide, hydrogen-doped indium oxide, zinc oxide, silicon oxide, silver, aluminum, or any combination thereof.

The intermediate layer (e.g., recombination layer) 216 disposed on a front surface of bottom silicon cell 204 may, for example, include indium tin oxide, indium zinc oxide, hydrogen-doped indium oxide, nano- or micro-crystalline silicon, nano- or micro-crystalline silicon oxide, or a combination thereof.

The perovskite top cell 202 is deposited on top of the intermediate layer 216, beginning with hole-contact stack 214. A blading process (e.g., a nitrogen-assisted blading process) can be used to deposit a conformal hole-contact stack and a planarizing perovskite absorber that fully covers the texturized silicon absorber 220. The deposition can occur at a speed in a range of about 1 m/min to about 10 m/min. The contact stacks 210 and 214 may, for example, include tin oxide, zinc oxide, titanium oxide, nickel oxide, tungsten oxide, molybdenum oxide, $N^2,N^2,N^{2'},N^{2'},N^7,N^7,N^{7'},N^{7'}$-octakis(4-methoxyphenyl)-9,9'-spirobi[9H-fluorene]-2,2',7,7'-tetramine (Spiro-OMeTAD), poly[bis(4-phenyl)(2,4,6-trimethylphenyl)amine] (PTAA), poly(triarylamine), fullerene, fullerene derivatives, or a combination thereof. The tandem photovoltaic device 200 is finished with a transparent conductive layer 208 and a metal grid 206. The transparent conductive layer 208 may, for example, include indium tin oxide, indium zinc oxide, hydrogen-doped indium oxide, or a combination thereof. The metal grid 206 may include, for example, include copper, silver, tin, nickel, or a combination thereof.

In another embodiment of this disclosure, such as that depicted in FIG. 2B, a tandem device 250 includes layers described with respect to FIG. 2A. The silicon bottom cell 204 of the tandem device 250 features a convex-shape surface texture 232 formed by acid chemical etching. Acid etching may be used with, for example, multicrystalline silicon wafers. During the etching process, temperature, etchants, time, or some combination thereof, may be applied so that the feature size of the convex-like texture is less than about 1 μm, less than about 1.5 μm, or less than about 2 μm. The etching process may, for example, include etchants of hydrofluoric acid, nitric acid, sulfuric acid, acetic acid, phosphoric acid, or a combination thereof. Processes described with respect to FIG. 2A can be used to fabricate the tandem device 250.

In some embodiments, layers of the tandem device architecture may be arranged in a different order. In one example, the order of the electron- and hole-contact stacks is reversed, such that the tandem device architecture has a textured silicon bottom cell planarized by a perovskite top cell and includes, from its front side to rear side, the following layers: a metal grid, a transparent conductive layer, a hole-contact stack, a perovskite absorber, an electron-contact stack, a recombination layer stack, a second hole-contact stack, a silicon absorber, a second electron-contact stack, and a rear-reflector stack.

In some embodiments, the surface texture, of any shape, is less than about 1 μm, less than about 1.5 μm, or less than about 2 μm in feature size. The surface-feature-forming process may be, for example, wet chemical etching, plasma dry etching, or nanoimprint lithography. In certain embodiments, the surface texture, of any shape, may be larger than about 1 μm, about 1.5 μm, or about 2 μm in feature size as initially etched, then reduced to less than about 1 μm, less than about 1.5 μm, or less than about 2 μm in feature size, respectively, by a second etching process. This second etching process may, for example, include wet chemical etching.

In some embodiments, the silicon bottom cell is planarized by the perovskite absorber or contact stack, for example, using a doctor-blade process, screen printing, slot-die coating, gravure printing, or spin coating. A nitrogen ($N_2$)-knife-assisted blading process helps remove solvent vapor, facilitating a quick transition of the perovskite or contact stack solution into solid during the blading process. A temperature of the substrate may be elevated (e.g., to at least 50° C., at least 60° C., at least 70° C., or in a range between about 60° C. and about 80° C.) to accelerate evaporation of the solvent. A perovskite absorber coated on top of a contact stack is preferably thick enough to bury the underlying features (e.g., pyramids) at least because protruding pyramids will shunt the top cell. The perovskite absorber is also preferably thin enough to collect photogenerated carriers. For carrier diffusion lengths on the order of about 1 μm, the perovskite absorber is preferably less than about 2 μm thick and free of outlier structures (e.g., pyramids). The thickness of a blade-coated perovskite absorber can be tuned through the concentration of the perovskite precursor, gap distance between the blade and the substrate, and the blade-coating speed.

Figure 3A:
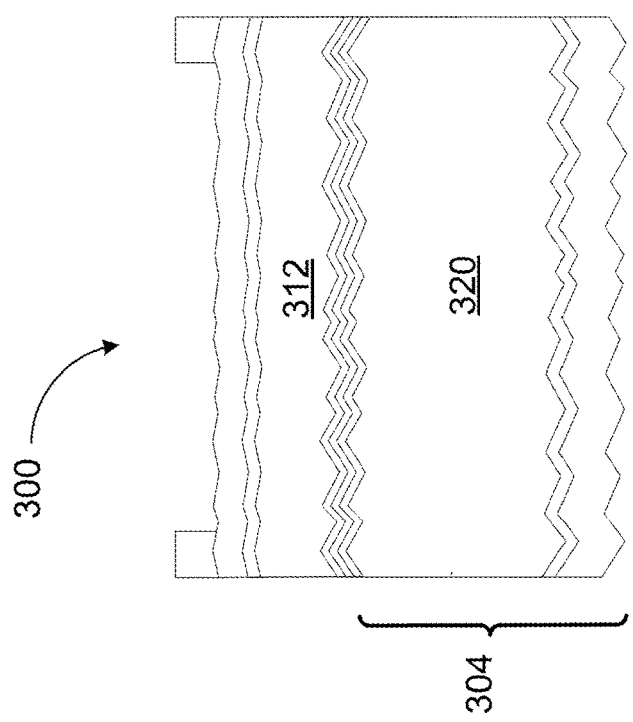

FIGS. 3A and 3B depict tandem devices 300 and 350 with silicon bottom cells 304. The silicon bottom cell 304 in tandem device 300 is planarized by the perovskite absorber 312. The silicon bottom cell 304 in tandem device 350 is planarized by a layer 332 (e.g., a recombination layer or a hole-contact stack) between the perovskite absorber 312 and the silicon bottom cell 304.

In some embodiments, the silicon bottom cell is a silicon heterojunction cell, a tunnel-oxide-passivated contact (TOPCon) cell, a passivated-emitter-rear-contact (PERC) cell, an aluminum-back-surface-field (Al-BSF) cell, or some combination thereof.

Figure 4:
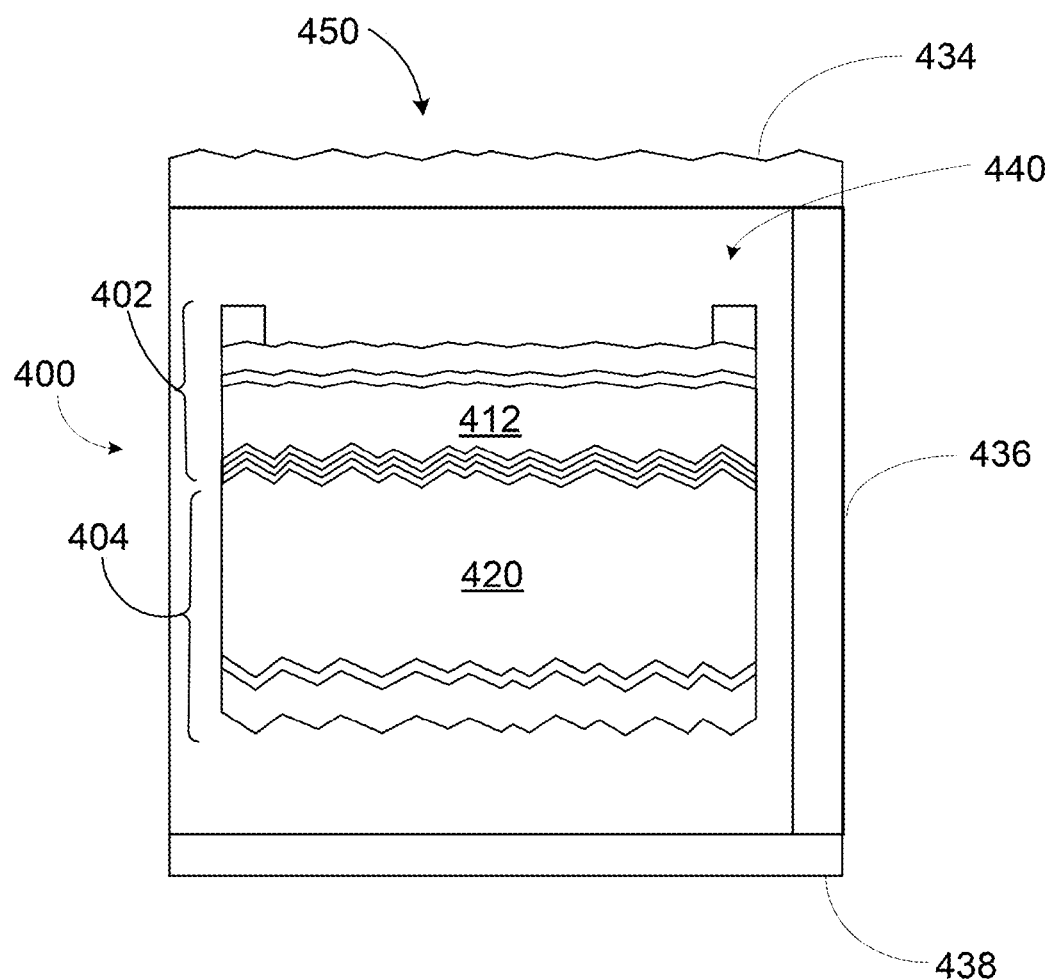
FIG. 4 depicts a tandem device encapsulated into a module.

Perovskite/silicon tandem devices can be encapsulated into modules in a glass-glass configuration or a glass-backsheet configuration. FIG. 4 depicts module 450 including tandem device 400 with perovskite top cell 402 and silicon bottom cell 404 encapsulated in a configuration with a front glass cover 434, edge seals 436, a back cover 438, and an encapsulant 440. The back cover is typically a glass cover or a backsheet. A backsheet typically includes a polymeric membrane material (e.g., TEDLAR) or stack of polymeric materials. Suitable materials for edge seals 436 include butyl rubber (e.g., polyisobutylene). Suitable materials for the encapsulant 440 include ethylene vinyl acetate, polyolefin, and silicone. The front glass cover 434 features a textured surface with features that scatter the light and reduce the front-surface reflectance. A mean height of the features is typically in a range of micrometers to millimeters. These tandem devices have minimal reflectance loss.

EXAMPLES

Optical Modeling. To investigate the disclosed tandem architecture (referred to as polydimethylsiloxane (PDMS)/planarized), optical simulations were performed with SunSolve software on four different perovskite/silicon tandem configurations, as depicted in FIGS. 5A-5D. The tandem device 500 (ARC/Flat) in FIG. 5A includes a perovskite top cell 502, a silicon bottom cell 504 with a flat front surface 506, and an anti-reflection layer 510 with a flat front surface 512. The tandem device 520 (PDMS/Flat) in FIG. 5B includes a perovskite top cell 502, a silicon bottom cell 504 with a flat front surface 506, and a light-scattering layer 514 with a pyramidal (3 µm height) front surface 516. The double-sided tandem device 540 (Fully Texturized) in FIG. 5C includes a conformal perovskite top cell 502 and a silicon bottom cell 504 with a pyramidal (3 µm height) front surface 506. The double-sided tandem device 560 (PDMS/Planarized) in FIG. 5D includes a silicon bottom cell 504 with a texturized (880 nm height) front surface 518, a planarizing perovskite top cell 502, and a light scattering layer 514 with a pyramidal (3 µm height) front surface 516. Relevant SunSolve parameters are listed in Table 1.

TABLE 1

SunSolve parameters used for optical modeling examples

| Layer | PDMS/Planarized | ARC/Flat | PDMS/Flat | Fully textured |
|---|---|---|---|---|
| PDMS | 1 mm | NA | 1 mm | NA |
| $MgF_2$ | NA | 140 nm | NA | NA |
| IZO | | 150 nm | | |
| $SnO_2$ | | 9.5 nm | | |
| $C_{50}$ | | 25 nm | | |
| Perovskite | 1200 nm (incoherent) | | 475 nm (coherent) | |
| PTAA | | 10 nm | | |
| ITO | | 20 nm | | |
| a-Si:H(n) | | 4 nm | | |
| a-Si:H(i) | | 4 nm | | |
| Silicon | | 250 µm | | |
| a-Si:H(i) | | 4 nm | | |
| a-Si:H(p) | | 11 nm | | |
| ITO | | 150 nm | | |
| Ag | | 300 nm | | |

The optical constants of each layer were characterized by using a M-2000 ellipsometer from J. A. Woollam, following the procedure published by Manzoor et al. (*Optics Express*, vol. 26, pp. 27441-27460, 2018). A model was configured as depicted in FIG. 5A (referred to as ARC/flat) with $MgF_2$ as an anti-reflection layer. This structure achieved a 25.4%-efficient tandem in practice. Other configurations were simulated by varying the surface morphologies (and light-scattering layers as indicated in FIGS. 5B-5D) while keeping the component layers of both sub-cells the same.

Replacing the $MgF_2$ layer with a surface that has optical properties similar to those of textured glass (in this case, polydimethylsiloxane (PDMS)), as depicted in FIG. 5B, reduces the reflection loss by almost 2 $mA/cm^2$, to 2.3 $mA/cm^2$, due at least in part to the "double-bouncing" effect introduced by the surface texture. With the fully textured configuration shown in FIG. 5C, the reflection loss is further reduced to 1.6 $mA/cm^2$. The PDMS/planarized tandem device depicted in FIG. 5D produces an almost identical reflectance curve to the fully textured one, with even slightly lower reflection loss of 1.4 $mA/cm^2$. Note that, in this configuration, in order to reproduce the "planarizing" perovskite layer, the software modeled the perovskite absorber as an incoherent layer. Therefore, the reflectance curve shows less interference than other configurations.

Pyramid Tuning. A first step in fabricating such a tandem structure with a planarizing perovskite layer can include tuning the pyramid size of the silicon wafer. In one experiment, four different potassium hydroxide based etching recipes were used to texture silicon wafers, resulting in different pyramid sizes. Scanning electron microscope (SEM) images of Recipes A-D are shown in FIGS. 6A-6D, respectively. The scale bar in each image represents 2 µm. Table 2 lists the composition of Recipes A-D.

TABLE 2

Composition of Recipes A-D

| Recipe | Temperature (° C.) | Time (minutes) | KOH (ml) | ALKA-TEX additive (ml) | $K_2SiO_3$ (ml) |
|---|---|---|---|---|---|
| A | 75 | 30 | 800 | 50 | None |
| B | 75 | 30 | 800 | 200 | None |
| C | 75 | 30 | 400 | 200 | 400 |
| D | 75 | 10 | 400 | 200 | 400 |

The above chemicals were added into a tank with 17 liters of deionized water.

Figure 6A:
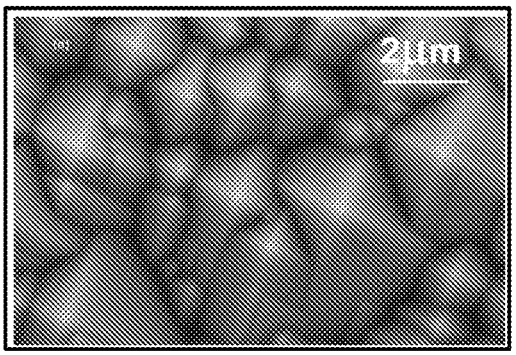
FIGS. 6A-6D show scanning electron microscope (SEM) images of silicon surface textures with different pyramid size.
Figure 6B:
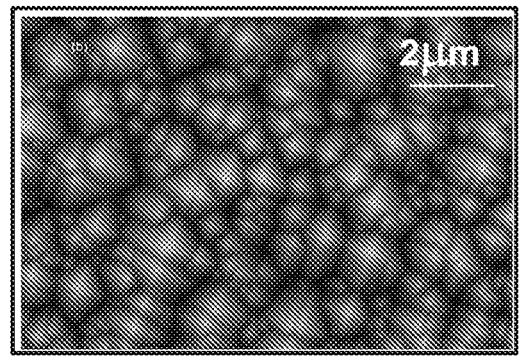
Figure 6C:
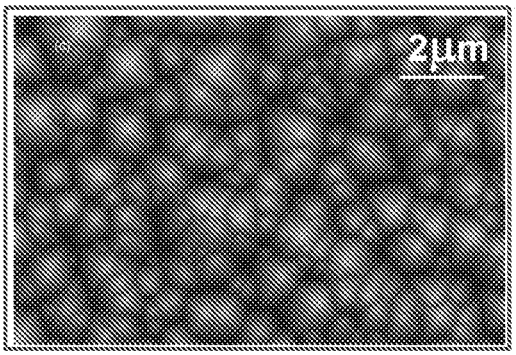
Figure 6D:
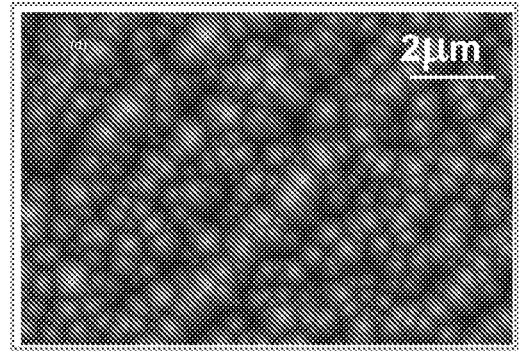

Recipe A (FIG. 6A) produced the largest pyramids. The pyramid height (peak-to-valley) distribution, obtained from atomic force microscope (AFM) measurement, shows a range of 0.4-2.5 µm, with a mean height of 1.3 µm. The as-textured wafer shows an AM1.5G-weighted reflectance (700-1100 nm) of 11.5%, demonstrating good light scattering compared to planar silicon wafers that usually have >33% reflectance. As the maximum height of the pyramids is 2.5 µm, which may be too large to planarize by a solution-processed perovskite top cell, other recipes were further developed. By tuning the amount of ALKA-TEX additive, the mean height of the pyramids, textured with Recipe B (FIG. 6B), was reduced to 0.55 µm with a tighter distribution. With additional potassium silicate, Recipe C (FIG. 6C) further reduced the mean pyramid height to 0.45 µm, with a maximum height of 0.8 µm. Diminishing the size of the pyramids moderately increased the reflectance of the wafer, resulting in weighted reflectances of 13.1% and 14.2% for Recipes B and C, respectively. With additional tuning of the etching time, a more uniform size distribution with a pyramid height range of 0.2-0.7 µm was obtained with Recipe D (FIG. 6D). However, the reflectance of this wafer increased significantly to 17.8%.

This increase of reflectance may be due to a change in how the incident light interacts with the pyramids. To investigate this, the angular-resolved reflectance (incident wavelength of 195 nm) of the textured wafers was measured. When the pyramids are large (Recipe A), the light is reflected primarily at an emerging angle of 18° off the incidence. When the pyramids become smaller, a second emerging angle at about 75° appears. Depending on where the light first is incident on the facet of a pyramid, the emerging angle can be different, with a higher emerging angle producing higher reflectance. For smaller pyramids, a greater fraction of the light hits a second pyramid at a high angle (close to normal), thus producing higher reflectance.

In another experiment, 17 n-type, as-cut, M2-sized Cz monocrystalline silicon wafers with a (100) orientation, a resistivity of 2-5 Ω·cm, and a thickness of 180 µm were used. As a reference, one wafer was textured with a recipe similar to Recipe A (referred to hereafter as microtextured) for 20 min in a solution that contained 2.8 wt % KOH and 0.14 wt % ALKA-TEX (GP Solar additive). The other 16 wafers first underwent a saw-damage removal (SDR) etch in a 30 vol % KOH solution for 5 min, and were then split into four groups of four wafers for texturing with smaller pyramids (referred to hereafter as nanotexturing). The four nanotexture solutions contained 1.4 wt % KOH, 1.1 wt %

ALKA-TEX, and either 0, 1, 3, or 5 wt % $K_2SiO_3$. For the four wafers within each group, the texturing time was varied from 5 to 20 min with a 5 min step. The etching temperature was kept constant at 80° C. in all cases. The etching depth and rate—which is specified for only one side of the wafer throughout this paper—were determined by weighing all 17 wafers with an electronic balance before and after texturing. Throughout the texturing process, the wafers were rinsed in flowing deionized (DI) water for 10 min—and sometimes longer, if necessary, until the water resistivity was above 8 MΩ·cm—between each step and were spin-dried after the last rinse.

Once the texturing was complete, the surface morphology was first qualitatively examined with SEM images. The secondary electron images were acquired with an acceleration voltage and probe current of 5 kV and 1.6 nA, respectively, using an Everhart-Thornley or through-the-lens detector. To complement these images, the pyramid size distribution was calculated from AFM images with a custom MATLAB code. The AFM scans were produced in tapping mode—for high resolution with minimal sample damage—using a MultiMode 8 instrument from Bruker. The tip was chosen to have a height of greater than 10 μm so that the cantilever did not come into contact with the peak of the pyramids while mapping. Moreover, a small tip radius of 8 nm was used in order to fully reach the bottom of the pyramid valleys. Due to the textures' large height variations, a slow scan rate of 0.5 Hz was chosen to avoid measurement artifacts. To best represent the textures, three different locations across each M2-sized wafer were scanned, for a total area of 75×25 μm². For the least and most dense textures this area covers 762 and 76,071 pyramids, respectively. To extract the pyramid height distributions from the AFM scans, the MATLAB code first compares the height value of each AFM pixel with those of its neighboring pixels to identify a pyramid peak. The algorithm then scans pixels radially—away from the pixel associated with the peak—until all of the valleys are found. The height of that pyramid is then tabulated as the difference between its peak and lowest valley. This process is repeated until all pyramids are quantified.

Following topological characterization, the wafers were evaluated optically. The spectral reflectance was measured over the wavelength range of 300-1200 nm, with a 5 nm step and an angle of incidence of 7°, using a PerkinElmer Lambda 950 spectrophotometer equipped with an integrating sphere. The average weighted reflectance was then calculated using the AM1.5G photon flux density from 400 to 1100 nm.

In a second experiment aimed at assessing the passivation quality that is possible with each texture, 17 additional wafers were textured in parallel with the first set of wafers with identical conditions. The organic residue from the texturing was removed with a piranha cleaning solution, containing 88 wt % sulfuric acid and 2.4 wt % hydrogen peroxide ($H_2O_2$), for 15 min at 110° C. Next, metal ions were removed with an RCA-B solution, containing 5.3 wt % hydrochloric acid and 4.0 wt % $H_2O_2$, for 10 min at 74° C. Finally, the native oxide was removed with a buffer oxide etchant, containing a 10:1 volume ratio of 36 wt % ammonium fluoride to 4.6 wt % hydrofluoric acid, for 1 min at room temperature. Similar to the texturing process, the wafers were rinsed with DI water between each step. The front side was then passivated with 6- and 5-nm-thick intrinsic and n-type amorphous silicon (a-Si:H) layers, respectively, and the rear side with 6- and 12-nm-thick intrinsic and p-type a-Si:H layers, respectively. These layers were deposited using a P5000 plasma-enhanced chemical vapor deposition (PECVD) tool from Applied Materials. After passivation, minority-carrier lifetimes were measured with a Sinton WCT-120 at five different locations across each wafer, and their average value was computed.

For a comprehensive evaluation of the nanotextures, a reference was first established by processing a microtexture in a solution with an etching rate of 0.43 μm/min. After etching for 20 min, the texture clearly had micrometer-sized pyramids, as revealed by the SEM image. The pyramid sizes were further quantified with AFM-extracted data, which show that the microtexture had an average pyramid size of 1674 nm, a pyramid size range of 6-4301 nm, and a density of $4 \times 10^5$ pyr/mm². This reference texture yields silicon heterojunction solar cells with average efficiencies above 20% and best efficiencies above 22%.

To successfully transition from this reference microtexture to a dense and uniformly sized nanotexture, two factors are considered: pyramid nucleation rate and pyramid growth rate. Here, the nucleation rate is defined as the number of pyramids formed per unit area per unit time, and the growth rate is defined as the height increase per pyramid per unit time. During the initial stages of texturing, if the nucleation rate is sufficiently high and the growth rate is sufficiently low, the nucleation sites can saturate the surface before any single pyramid approaches 1 μm in height. This is an ideal condition for nanotexture, as, with longer etching durations, the heavily nucleated surface will then grow dense with uniformly sized pyramids. The degree to which a surface is site-saturated depends on the ratio of the nucleation to growth rates, P, rather than their absolute values. Moreover, a spatially uniform texture requires the nucleation and growth rates across the wafer to be homogeneous. With this in mind, three parameters from the microtexturing process were adjusted to maximize P while maintaining homogeneous nucleation and growth rates: the initial wafer surface condition, the solution composition, and the solution temperature.

The initial wafer surface after wire sawing has a high defect density that would reduce the homogeneity of the nucleation and growth rates, as both parameters are higher at defect sites. An SDR step to smooth the surface prior to texturing promotes a spatially uniform texture. In addition, this surface treatment is crucial for excellent passivation, as saw-damage features have been shown to be up to 5 μm deep. Unlike microtextures—with etch depths greater than 7 μm—nanotexturing etches only 0.3-2 μm. Thus, the nanotexturing process alone is insufficient to completely eliminate saw damage and an SDR treatment with an etching depth of approximately 8 μm was used here.

The solution composition was also adjusted to reduce the pyramid growth rate of the microtexture and incentivize nucleation. The reference composition etches 0.45 μm/min and can in principle produce an average pyramid height of nearly 1 μm after just one minute. Such fast texturing makes precise texture control at the sub-micrometer length scales difficult. Thus, the etching rate was slowed down threefold to 0.13 μm/min by reducing the KOH concentration by half. In addition, the concentration of the ALKA-TEX additive was increased to further boost P and the homogeneity of the nucleation and growth rates. This wetting agent is an environmentally friendly alternative to isopropanol that reduces the surface tension of hydrogen bubbles on the silicon surface so that they detach more easily. Consequently, the additive allows water molecules and hydroxyl ions ($OH^-$)—which principally react with and etch the silicon surface—to spread more evenly during the texturing process. This, in turn, increases the nucleation rate, reduces the growth rate, and improves their homogeneity. An adequate concentration of this additive was found to be eight times that of the microtexture composition; accordingly, this change was applied to all four nanotexture solutions.

The solution temperature was the last parameter explored; it was initially dropped from 80° C. to 75° C. to try to reduce the pyramid growth rate and increase P. Although a reduction in the growth rate was indeed achieved, a stronger reduction in the nucleation rate was observed, sending P in the wrong direction. This resulted in incomplete texturing, with areas having little-to-no pyramid coverage. Therefore, in favor of faster nucleation kinetics, the temperature was returned to 80° C.

Wafers textured for the same time (20 min) with the nanotexture solution (without $K_2SiO_3$) and reference microtexture solution, respectively, validate that the aforementioned changes substantially reduce the pyramid size. Size distribution data confirms that the former is indeed a nanotexture with an average pyramid size of 505 nm, a pyramid size range of 42-1140 nm, and a density of $4 \times 106$ pyr/mm$^2$. This represents a 70% reduction in average pyramid size, a 74% reduction in pyramid size range, and an order of magnitude increase in pyramid density compared to the microtexture reference.

To enable further size control, 1, 3, and 5 wt % $K_2SiO_3$ was added to the etching solution. The etching rate was slowed from 0.13 to 0.05 μm/min as the $K_2SiO_3$ concentration increased from 0 to 5 wt %, a linear decrease with a slope of −0.02 μm/min. In concert with varying etching time, these new solutions produced 15 other nanotextures with a wide variety of pyramid sizes. Their size distributions reveal that the average pyramid size of the nanotextures ranged from 62 to 512 nm. Moreover, their size uniformity was excellent: the least uniform texture—which was etched for 15 min without $K_2SiO_3$—had minimum and maximum pyramid sizes of 27 and 1226 nm, and the most uniform texture—which was etched for 5 min with 5 wt % $K_2SiO_3$—had minimum and maximum pyramid sizes of 14 and 246 nm. Out of the 16 nanotextures, only four had pyramids taller than 1 μm, with the least uniform texture having only 0.3% of the pyramids over 1 μm.

$K_2SiO_3$ is effective in controlling texture size because it provides molecular species to regulate the growth rate. During the initial stages of texturing—prior to nucleation—this additive decomposes into silicate ($SiO_3^{2-}$) that bonds with the silicon surface. A uniform, mesh-like, nano mask forms as a result of this reaction, and a finer mesh size can be achieved with higher concentrations of silicate. As with ALKA-TEX, this mask helps in evenly spreading the water molecules and OH— ions, thereby reducing the growth rate. After only 5 min of etching without $K_2SiO_3$, the average pyramid size quickly grew to 400 nm. On the other hand, with a slower growth rate from the solution containing 3 wt % $K_2SiO_3$, obtaining average pyramid heights closer to 100, 200, and 300 nm was less challenging.

The silicate mask increases the nucleation rate and decreases the growth rate to boost P for a dense texture. This effect can be seen with sufficiently high $K_2SiO_3$ concentrations: For example, while the two nanotextures which were etched with 3 wt % $K_2SiO_3$ for 10 min and 5 wt % $K_2SiO_3$ for 20 min, respectively—have a similar average pyramid size (a difference of only 19 nm), the latter nanotexture is denser by 56%. Note, however, that a density increase does not immediately translate into higher surface coverage, since the base size of the pyramids is a determining factor as well. Rather, it facilitates the fabrication of a smaller texture (given sufficient etching time). This was the case for the nanotextures processed with 3 and 5 wt % $K_2SiO_3$; they require longer etching times to fully texture the surface.

To evaluate the light-trapping capabilities of the fabricated nanotextures, their reflectance was measured from 300 to 1200 nm. Nearly half of the nanotextures—those etched with 0 and 1 wt % $K_2SiO_3$ and that had average pyramid sizes larger than 400 nm—have reflectance spectra similar to the microtexture. For wavelengths beyond 500 nm, the reflectance of the nanotextures starts to deviate higher, with a largest difference from the microtexture of approximately 2.5% (absolute) at around 1000 nm. A possible explanation for this behavior is that the smallest pyramids are no longer seen as geometric features by longer-wavelength light, but act instead as an effective medium. The other half of the nanotextures—those etched with 3 and 5 wt % $K_2SiO_3$—have reflectance several percent higher than the microtexture. The reflectance is correlated to the average pyramid size, but a primary cause is that these wafers have flat, untextured areas that specularly reflect light. An extreme case (5 wt % $K_2SiO_3$ for 5 mins), results in a reflectance spectrum resembling that of a polished wafer.

The optical performance of the wafers with their AM1.5G-weighted reflectance as a function of etching depth can be summarized as follows. The nearly half of the nanotextures that yield similar reflectance values to the microtexture do so with considerably less silicon etched off during the texturing process itself. Although the extra SDR step used here ends up removing the same amount of silicon as with microtexturing, this is a limitation imposed by the saw-damage layer. For silicon wafers without saw damage—e.g., those from direct wafer growth or kerfless wafering—the nanotexture, even with the greatest etching depth explored here, would consume 67% less silicon than that of the microtexture, while its AM1.5G-weighted reflectance would be only 1% higher. If 2.3% higher reflectance were tolerable, 84% of the removed silicon could be saved with a nanotexture (1 wt % $K_2SiO_3$, 10 min). This is not a great concern for the approximately 150-μm-thick wafers that are standard today, but it could be an enabler for ultra-thin silicon solar cells.

The passivation quality achievable with a given surface texture is at least as important in a solar cell as its reflectance. All but one nanotexture enabled excellent minority-carrier lifetime after passivation with a-Si:H, with values of 1.7-3.4 ms, comparable to that of the standard microtexture. This demonstrates that, despite the increase in the areal density of valleys of nanotextures, proper texturing, cleaning, and passivation can effectively suppress surface recombination and interface quality does not have to be compromised. The nanotexture with a low minority-carrier lifetime of approximately 0.5 ms, which was etched for 5 min without $K_2SiO_3$, received an insufficient SDR treatment; photoluminescence images indicate that the saw damage was not completely eliminated.

In selecting a given nanotexture, several properties can be considered in parallel, and each application may give these different weights. For example, for a silicon wafer intended for use as a bottom cell in a perovskite/silicon tandem with a blade-coated perovskite layer, an increase in reflectance may be tolerated if it is accompanied by a reduction of the maximum pyramid height to below, e.g., 500 nm. (The reflectance of the full tandem is typically more dependent on the morphology of the front surface of the perovskite top cell than that of the bare silicon wafer.)

As demonstrated, it is possible to fabricate a nanotexture with wet-chemical etching with performance comparable to the standard microtexture: out of the 16 nanotextures, six have a minority-carrier lifetime greater than 1 ms and an AM1.5G-weighted reflectance less than 15% (and maximum pyramid heights below 1.1 µm). Adding $K_2SiO_3$ to the texturing solution provides intimate pyramid size control by increasing P, but it also leaves flat areas on the wafers at short etching times. A probable solution to this trade-off is to extend the etching time as the $K_2SiO_3$ concentration is increased, and to monitor the pyramid density. Compare the nanotextures etched with 3 wt % $K_2SiO_3$ for 10 min and 5 wt % $K_2SiO_3$ for 20 min: Although their average pyramid sizes are nearly the same, the wafer etched with 5 wt % had an AM1.5G-weighted reflectance 3.5% lower than that processed with 3 wt % at least in part because it has a 56% higher pyramid density. However, the absolute reflectance of this sample is still high at least in part because there remain untextured areas. Consequently, for the highest $K_2SiO_3$ concentrations, the etching time should be further extended beyond the 20-min maximum explored in this study to produce wafers with less than 15% reflectance and unprecedented (small) pyramids. Finally, passivation quality can be independent of texture size, and thus surface recombination should not be a limiting factor for emerging technologies requiring nanotextures.

Perovskite Deposition Process. A challenge is to produce dense perovskite absorbers at these thicknesses that are in intimate contact with the textured silicon surface. This problem can be eliminated through solvent engineering designed to balance solution drying and perovskite grain growth. In one instance, for 1.55 M $Cs_{0.1}MA_{0.9}Pb(I_{0.9}Br_{0.1})_3$ perovskite precursor in 2-methoxyethanol (2-ME) with 0.05 mol % ratio of surfactant L-a-phosphatidylcholine (LP) to Pb, the ratio of DMSO/Pb in precursor was tuned from 0 to 50 mol % because DMSO coordinates with the perovskite and is thus expected to change the drying and crystallization processes. For solid-state perovskite films after drying and before annealing (referred to hereafter as dry films), void-free coverage of the textured wafer occurs for DMSO/Pb ratios between 6 and 50 mol. Conversely, there is an extended void between the dry film and wafer for DMSO/Pb ratios of 3 mol % or less. After annealing at 70° C. for 10 min and 100° C. for 15 min, the perovskite film remains dense for DMSO/Pb ratios of 6-25 mol %, but voids appear at the bottom of and inside the annealed film with a DMSO/Pb ratio of 50 mol %. The surfactant LP in the perovskite precursor also facilitates the formation of void-free dry films on the textured surfaces by suppressing the Marangoni solution flow inside wet films.

An additive concentration of 25 mol % DMSO enables a dense $Cs_{0.1}MA_{0.9}Pb(I_{0.9}Br_{0.1})_3$ film to be blade coated from a low-boiling-point solvent (2-ME) at a speed of 25 mm/s or 1.5 m/min. Both the dry and annealed films are dense and fully cover the textured wafer, with a thickness of approximately 1.5 µm measured from the valleys of the pyramids. Bladed perovskite films on textured wafers and on flat reference wafers show nearly the same photoluminescence intensities and charge-carrier recombination lifetime, indicating their high quality. Furthermore, this engineered perovskite solution works not only for blade coating but also for spin coating of films onto sub-micrometer-textured silicon.

To understand how the dense perovskite films form on the textured wafers, the process was decoupled into three steps: wet film formation by blade coating, film drying by $N_2$-blowing, and film crystallization by annealing. During blade coating, a layer of perovskite solution is transferred onto the substrate. The solvent is primarily 2-ME with a small amount of DMSO, where 2-ME is highly volatile but non-coordinating with the perovskite material, and DMSO is nonvolatile but can coordinate with the perovskite material to form an intermediate phase. During $N_2$-blowing, 2-ME quickly volatilizes, leaving dry films coordinated with DMSO. Due to the limited amount of DMSO, the dry films are often a mixture of perovskite and perovskite-DMSO intermediate phase. Subsequent annealing converts the intermediate phases to perovskite, accompanied by grain growth. To investigate whether the extended voids between the dry films and textured wafers are formed during wetting or drying, a sample was frozen right after blading the perovskite solution and examined under cryo scanning electron microscopy (cryo-SEM). DMSO-free perovskite solution fully fills the pyramid valleys, revealing that it is the drying process that causes void formation. Drying starts at the solution/air interface as the solvent at the top surface evaporates, quickly forming a solid top shell. The solid film then grows from the shell downward as the remaining solution dries, leaving voids when the last 2-ME solvent evaporates and no perovskite precursor remains to fill its volume. For solutions with DMSO, the quick formation of a top solid shell is inhibited by its high boiling point and strong chemical coordination with the perovskite. That is, the perovskite-DMSO intermediate-phase particles interrupt shell formation and allow 2-ME solvent to evaporate, suppressing the void formation.

However, when the perovskite solution has too much DMSO, the dry film still fully fills the pyramid valleys, but annealing causes voids to form. This can be explained by the shrinkage of the dry film upon annealing due to the removal of DMSO from the intermediate phase. To illustrate this, the thickness of a perovskite film coated from a precursor with a DMSO/Pb ratio of 25 mol % onto a PTAA-coated ITO/glass substrate was measured. The thickness decreased by 13% after annealing, and films with other DMSO concentrations similarly shrank in proportion to their concentrations. As with the drying of films with too little DMSO, the annealing-induced crystallization of films with too much DMSO proceeds from the top surface downward and produces voids when the last solvent—in this case, DMSO instead of 2-ME—leaves. Only for moderate and small DMSO concentrations (≤25% in this experiment) can the volume reduction upon DMSO departure be compensated by perovskite diffusion, thus maintaining a dense perovskite film on textured silicon after annealing.

A desirable condition for a dense perovskite absorber layer on textured silicon is thus $N_2$-assisted blade coating at room temperature, followed by thermal annealing for perovskite crystallization. It was found that combining the drying and crystallization processes by blade coating the perovskite film on a hot substrate with a $N_2$ knife generates voids between the perovskite film and textured silicon substrate after blading. This is believed to be because the hot substrate accelerates the drying of the perovskite precursor, which forms a solid shell on the top of the film and create voids at the bottom.

Figure 7A:
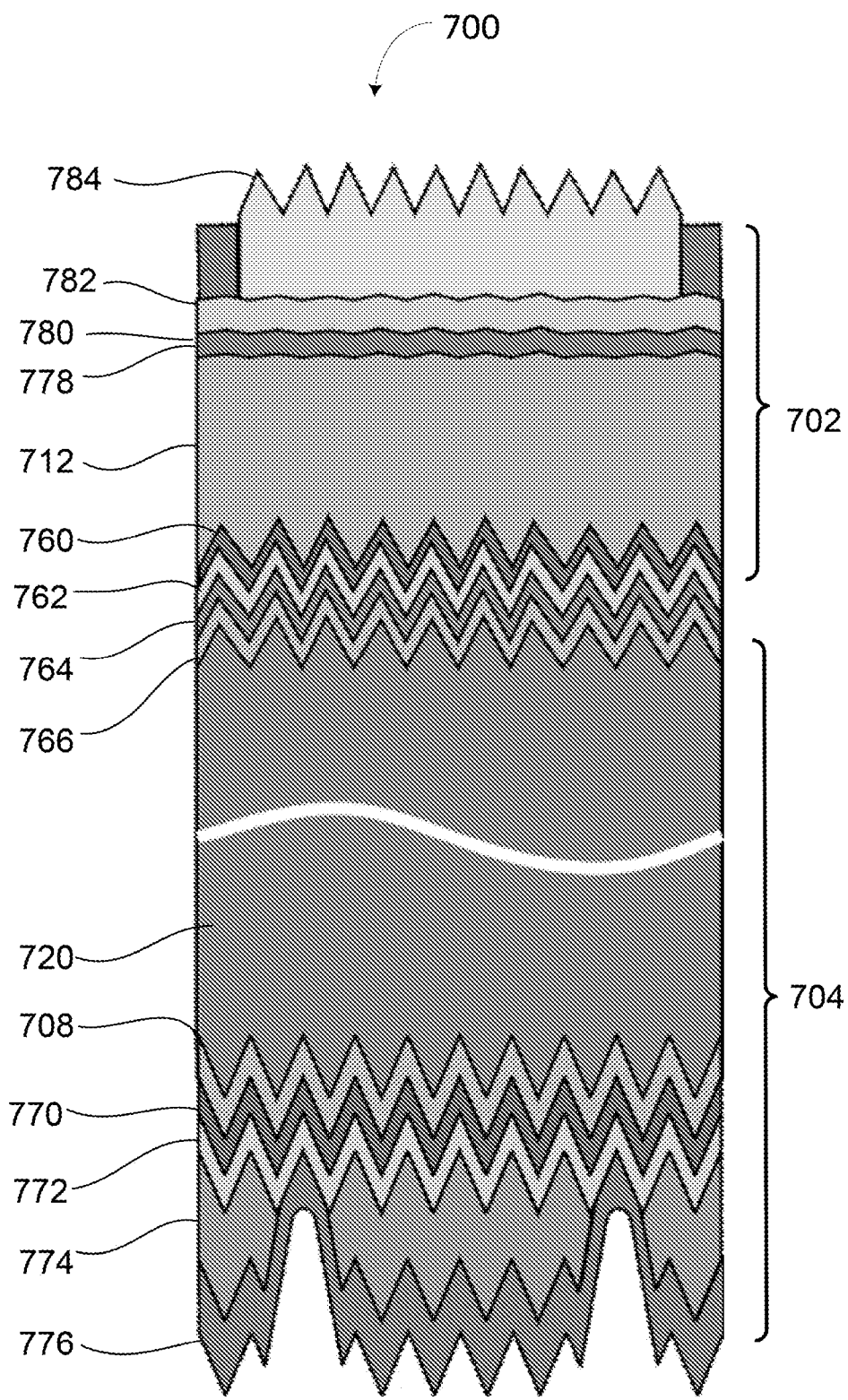
FIG. 7A depicts a perovskite/silicon tandem device fabricated as described herein.

Tandem Results. With an optimized blade-coating process to apply the perovskite solar cell, a perovskite/silicon tandem photovoltaic device 700 was fabricated with the detailed cell schematic shown in FIG. 7A. The silicon bottom cell 704 featured double-side pyramidal texture with a maximum pyramid height of less than 0.8 µm, formed by texturing Recipe C. The amorphous silicon heterojunction contacts were the same as described by Chen et al. (*Joule*, vol. 3, pp. 177-190, 2019), which is incorporated by reference herein. The silicon bottom cell 704 includes conformal layers on the rear side of the silicon absorber (c-Si (n)) 720.

Conformal layers on the front side of the silicon silicon bottom cell include PTAA 760, front ITO 762, a-Si:H (n$^+$) 764, and a-Si:H (i) 766. Conformal layers on the rear side of the silicon absorber 720 include a-Si:H (i) 768, a-Si:H (p$^+$) 770, indium tin oxide (ITO) 772, silica nanoparticles (300-nm-thick coating) 774, and silver 776. The silica nanoparticle coating 774 was inserted between the indium tin oxide layer 772 and the silver layer 776 to reduce the parasitic absorption and boost the infrared (IR) light response of the silicon bottom cell. This IR-transparent silver layer was spray coated by the aerosol-impact-driven-assembly (AIDA) technique described by Firth et al. (*Applied Nano Materials*, vol. 1, pp. 4351-4357, 2018), which is incorporated herein by reference, and the refractive index was tuned to 1.2 by controlling the porosity of the film during the deposition. On the front side of the silicon bottom cell 704, an indium tin oxide layer 762 was used as a recombination layer to connect the perovskite top cell 702.

The perovskite top cell 702 was formed on top of the silicon cell with blade-coating and other processes, as described by Deng et al. (*Nature Energy*, vol. 3, pp. 560-566, 2018), which is incorporated herein by reference. Briefly, the perovskite top cell 702 was fabricated by blade coating a poly (bis(4-phenyl)) (2,4,6-trimethylphenyl) amine (PTAA) layer 760, blade coating a perovskite layer 712, thermally evaporating a C60 layer 778, depositing a tin oxide layer 780 by atomic layer deposition, and sputtering an indium tin oxide layer 782. Finally, the device was capped with a textured PDMS light scattering layer 784, which acts as a proxy for textured module glass, as described by Manzoor et al. (*Solar Energy Materials and Solar Cells*, vol. 173, pp. 59-65, 2017), which is incorporated herein by reference. A reference PDMS/flat tandem was also fabricated with the same layer construction but with a flat interface between the perovskite and silicon sub-cells, as depicted in FIG. 5B.

Figure 7B:
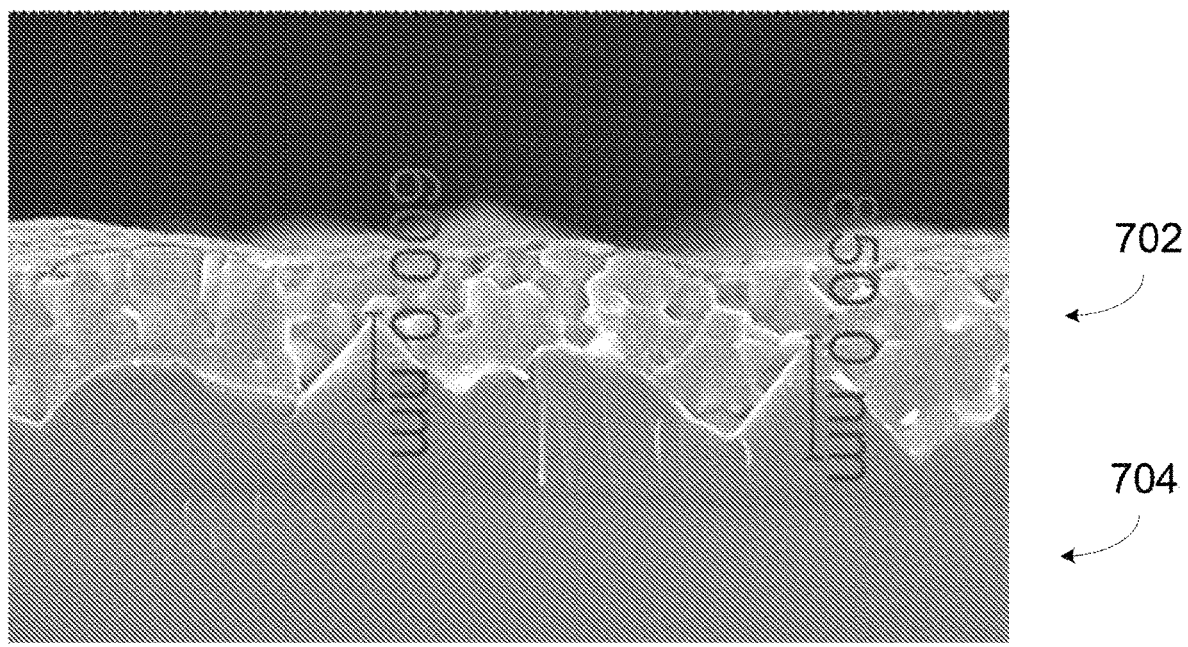
FIG. 7B is a cross-section SEM image of the tandem device before adding a PDMS light-scattering layer. Chen at al., Joule 3, 177-190, is incorporated herein by reference for additional details.

A SEM cross-section image (without the PDMS layer), as shown in FIG. 7B, confirms that the perovskite top cell 702 planarized the textured silicon bottom cell 704. Compared to the reference flat tandem structure, one improvement in device performance was from the short-circuit current density ($J_{sc}$). As revealed by external quantum efficiency (EQE) measurements, the $J_{sc}$ of the sub-cells were current matched at 19.3 mA/cm$^2$, with a summed photo-generated current density of 38.7 mA/cm$^2$. This number is 2.4 mA/cm$^2$ higher than for the reference flat tandem without the PDMS layer (structure depicted in FIG. 5A, but without anti-reflection coating), and 0.8 mA/cm$^2$ higher than the reference PDMS/flat tandem (structure depicted in FIG. 5B). The current improvement may be attributed at least in part to two phenomena. First, although the layer structure of the perovskite cells is the same for both the PDMS/planarized and PDMS/flat devices, the PDMS/planarized tandem shows higher blue response. Second, due at least in part to the light-scattering effect introduced by the texture at the perovskite/silicon interface, the reflectance from 750-1100 nm is considerably lower in the PDMS/planarized tandem due to the elimination of interference fringes, resulting in a flat EQE of ~95% in that band. This EQE improvement did not result in a higher $J_{sc}$ in the silicon bottom cell compared to the PDMS/flat reference device, however, due at least in part to the reduced transmission in the 600-750 nm range. This is believed to be at least in part because the perovskite layer in the PDMS/planarized tandem is thicker than that in the reference device, as needed to planarize the pyramidal texture of the silicon bottom cell. The current loss from reflection for the PDMS/planarized tandem is 2.3 mA/cm$^2$. The main current loss mechanism in this device is believed to be parasitic absorption (e.g., in the electron contact of the perovskite cell, as evident from the gap between the 1-reflectance and EQE curves between 300-600 nm). The current-voltage measurement of the device showed an efficiency of 25.1%.

Although this disclosure contains many specific embodiment details, these should not be construed as limitations on the scope of the subject matter or on the scope of what may be claimed, but rather as descriptions of features that may be specific to particular embodiments. Certain features that are described in this disclosure in the context of separate embodiments can also be implemented, in combination, in a single embodiment. Conversely, various features that are described in the context of a single embodiment can also be implemented in multiple embodiments, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular embodiments of the subject matter have been described. Other embodiments, alterations, and permutations of the described embodiments are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results.

Accordingly, the previously described example embodiments do not define or constrain this disclosure. Other changes, substitutions, and alterations are also possible without departing from the spirit and scope of this disclosure.

What is claimed is:

1. A tandem photovoltaic device comprising:
   a silicon photovoltaic cell comprising a monocrystalline silicon layer;
   a perovskite photovoltaic cell comprising a perovskite layer; and
   an intermediate layer between a rear side of the perovskite photovoltaic cell and a front side of the silicon photovoltaic cell,
   wherein the front side of the monocrystalline silicon layer has an alkali-etched textured surface having angular protrusions, with a maximum peak-to-valley height of the angular protrusions of less than 2.5 µm, and the textured surface is planarized by the perovskite layer of the perovskite photovoltaic cell.

2. The tandem photovoltaic device of claim 1, wherein the angular protrusions are pyramidal, inverted pyramidal, or a combination thereof.

3. The tandem photovoltaic device of claim 1, wherein the textured surface has concave regions.

4. The tandem photovoltaic device of claim 1, wherein the silicon photovoltaic cell is a bottom cell and the perovskite photovoltaic cell is a top cell.

5. The tandem photovoltaic device of claim 1, wherein the perovskite photovoltaic cell further comprises an electron-contact stack and a hole-contact stack, and the silicon photovoltaic cell comprises an electron-contact stack and a hole-contact stack.

6. The tandem photovoltaic device of claim 1, wherein the silicon photovoltaic cell is a silicon heterojunction cell.

7. The tandem photovoltaic device of claim 6, wherein the silicon cell is a passivated-emitter-rear-contact cell, a tunnel-oxide-passivated-contact cell, an aluminum-back-surface-field cell, or a combination thereof.

8. The tandem photovoltaic device of claim 1, further comprising a light-scattering layer.

9. A method of forming the tandem photovoltaic device of claim 1, the method comprising:
   texturing the monocrystalline silicon layer of the silicon photovoltaic cell to yield the alkali-etched textured surface; and
   operatively coupling the perovskite photovoltaic cell to the silicon photovoltaic cell, thereby forming the tandem photovoltaic device and planarizing the textured surface.

10. The method of claim 9, wherein texturing the monocrystalline silicon layer comprises wet chemical etching.

11. The method of claim 10, wherein the wet chemical etching comprises alkaline chemical etching.

12. The method of claim 9, wherein planarizing the textured surface comprises a solution coating process.

13. The method of claim 12, wherein the solution coating process comprises doctor-blading, screen printing, slot-die coating, gravure printing, or spin coating.

14. The method of claim 9, wherein the perovskite photovoltaic cell is operatively coupled to the silicon photovoltaic cell by an intermediate layer.

15. The method of claim 14, wherein planarizing the textured surface of the silicon-containing layer of the silicon photovoltaic cell comprises disposing the perovskite layer on the intermediate layer.

16. The method of claim 14, wherein the intermediate layer is a recombination layer.

17. A photovoltaic module comprising:
   a first cover;
   a second cover, wherein the second cover is opposite the first cover;
   the tandem photovoltaic device of claim 1, wherein the tandem photovoltaic device is positioned between the first cover and the second cover.

18. The photovoltaic module of claim 17, wherein at least one of the first cover and the second cover comprises a textured glass.

19. The photovoltaic module of claim 17, further comprising a light scattering layer.

20. The tandem photovoltaic device of claim 2, wherein the angular protrusions are pyramidal, and the pyramidal angular protrusions are faceted.

21. The tandem photovoltaic device of claim 20, wherein the pyramidal angular protrusions have four facets.

22. The tandem photovoltaic device of claim 1, wherein an average reflectance, weighted by the AM1.5G photon flux density from 400 to 1100 nm, of the front side of the silicon layer is less than 15%.

23. The tandem photovoltaic device of claim 1, wherein a distribution of the peak-to-valley height of the angular protrusions is in a range of 0.4 µm to 2.5 µm.

24. The tandem photovoltaic device of claim 1, wherein a distribution of the peak-to-valley height of the angular protrusions is in a range of 0.2 µm to 0.7 µm.

25. The tandem photovoltaic device of claim 1, wherein less than 0.3% of the angular protrusions have a peak-to-valley height exceeding 1 µm.

26. The tandem photovoltaic device of claim 1, wherein the maximum peak-to-valley height of the angular protrusions is less than 1.1 µm.

27. The tandem photovoltaic device of claim 1, wherein the maximum peak-to-valley height of the angular protrusions is less than 0.8 µm.

* * * * *